US012812844B2

(12) United States Patent
Won et al.

(10) Patent No.: US 12,812,844 B2
(45) Date of Patent: Nov. 24, 2026

(54) SEMICONDUCTOR DEVICE INCLUDING FENCE PATTERN ON LANDING PAD

(71) Applicant: Samsung Electronics Co., Ltd., Suwon-si (KR)

(72) Inventors: Seokjae Won, Suwon-si (KR); Jaehong Park, Suwon-si (KR); Yoongoo Kang, Suwon-si (KR); Dongyoung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 269 days.

(21) Appl. No.: 18/426,694

(22) Filed: Jan. 30, 2024

(65) Prior Publication Data

US 2025/0024664 A1 Jan. 16, 2025

(30) Foreign Application Priority Data

Jul. 13, 2023 (KR) ........................ 10-2023-0091042

(51) Int. Cl.
*H10B 12/00* (2023.01)

(52) U.S. Cl.
CPC ......... *H10B 12/488* (2023.02); *H10B 12/315* (2023.02); *H10B 12/482* (2023.02); *H10B 12/485* (2023.02)

(58) Field of Classification Search
CPC .. H10B 12/482; H10B 12/485; H10B 12/315; H10B 12/0335
See application file for complete search history.

(56) References Cited

U.S. PATENT DOCUMENTS

| | | | | |
|---|---|---|---|---|
| 7,972,956 B2 | 7/2011 | Kang et al. | | |
| 9,287,159 B2 | 3/2016 | Kim et al. | | |
| 10,037,999 B2 | 7/2018 | Kim et al. | | |
| 10,438,802 B2 | 10/2019 | Park et al. | | |
| 10,665,580 B1 * | 5/2020 | Hosoda | H10W 90/00 | |
| 2015/0061134 A1 * | 3/2015 | Lee | H10W 20/072 | 257/751 |
| 2015/0214146 A1 * | 7/2015 | Kim | H10B 12/0335 | 257/773 |

(Continued)

FOREIGN PATENT DOCUMENTS

| | | |
|---|---|---|
| CN | 112582417 A | 3/2021 |
| KR | 101983309 B1 | 5/2019 |

(Continued)

*Primary Examiner* — Nduka E Ojeh
(74) *Attorney, Agent, or Firm* — Wolf, Greenfield & Sacks, P.C.

(57) ABSTRACT

Disclosed is a semiconductor device comprising an active pattern on a substrate and surrounded by a device isolation pattern, a word line that extends in a first direction and is on the active pattern and the device isolation pattern in a first direction parallel to a bottom surface of the substrate, a bit line that extends on the active pattern in a second direction intersecting the first direction, a storage node contact on the active pattern, a landing pad that includes a lower landing pad and an upper landing pad that are sequentially provided on the storage node contact with an interface therebetween, and a fence pattern on the word line and a lateral surface of the landing pad. A top surface of the fence pattern is has a height higher than a height a top surface of the lower landing pad.

20 Claims, 23 Drawing Sheets

(56) References Cited

U.S. PATENT DOCUMENTS

| | | | | |
|---|---|---|---|---|
| 2015/0380508 | A1 | 12/2015 | Kim et al. | |
| 2016/0064270 | A1* | 3/2016 | Lee | H10B 12/0335 438/655 |
| 2016/0276349 | A1* | 9/2016 | Kwon | H10B 12/0335 |
| 2020/0203354 | A1* | 6/2020 | Lee | G11C 5/063 |
| 2022/0076998 | A1 | 3/2022 | Wu | |
| 2022/0115382 | A1* | 4/2022 | Lee | H10B 12/315 |
| 2022/0139921 | A1* | 5/2022 | Kim | H10B 12/0335 |
| 2022/0165657 | A1 | 5/2022 | Park et al. | |
| 2022/0238534 | A1 | 7/2022 | Seong et al. | |
| 2022/0406789 | A1 | 12/2022 | Jeon et al. | |
| 2023/0017800 | A1 | 1/2023 | Sung | |
| 2023/0217649 | A1 | 7/2023 | Lee et al. | |

FOREIGN PATENT DOCUMENTS

| | | | |
|---|---|---|---|
| KR | 20200131191 | A | 11/2020 |
| KR | 102198857 | B1 | 1/2021 |
| TW | 202236613 | A | 9/2022 |

* cited by examiner

SEMICONDUCTOR DEVICE INCLUDING FENCE PATTERN ON LANDING PAD

CROSS-REFERENCE TO RELATED APPLICATION

This U.S. nonprovisional application claims priority under 35 U.S.C § 119 to Korean Patent Application No. 10-2023-0091042 filed on Jul. 13, 2023 in the Korean Intellectual Property Office, the disclosure of which is hereby incorporated by reference in its entirety.

BACKGROUND

The present inventive concepts relate to a semiconductor, and more particularly, to a semiconductor device.

Semiconductor devices have an important role in the electronic industry because of their small size, multi-functionality, and/or low fabrication cost. Semiconductor devices may be categorized as any one of semiconductor memory devices storing logic data, semiconductor logic devices processing operations of logic data, and hybrid semiconductor devices having both memory and logic elements.

Recently, high speed and low power consumption of electronic products may require that semiconductor devices embedded in the electronic products should have high operating speed and/or lower operating voltage. For satisfying the above demands, semiconductor devices have been more highly integrated. The high integration of semiconductor devices may cause to reduce reliability of the semiconductor devices. Therefore, various research studies have been conducted for enhancing the reliability of semiconductor devices.

SUMMARY

Some embodiments of the present inventive concepts provide a semiconductor device whose productivity is increased.

An object of the present inventive concepts is not limited to the mentioned above, and other objects which have not been mentioned above will be clearly understood to those skilled in the art from the following description.

According to some embodiments of the present inventive concepts, a semiconductor device may include an active pattern on a substrate and surrounded by a device isolation pattern in plan view; a word line that extends in a first direction and is on the active pattern and the device isolation pattern, the first direction is parallel to a bottom surface of the substrate; a bit line that extends in a second direction on the active pattern, the second direction intersects the first direction; a storage node contact on the active pattern; a landing pad that includes a lower landing pad and an upper landing pad with an interface therebetween that are stacked on the storage node contact; and a fence pattern on the word line and a lateral surface of the landing pad. A top surface of the fence pattern may be higher than a a top surface of the lower landing pad adjacent the interface between the lower landing pad the upper landing pad, with respect to the substrate.

According to some embodiments of the present inventive concepts, a semiconductor device may include an active pattern on a substrate and surrounded by a device isolation pattern in plan view; a word line that extends in a first direction and is on the active pattern and the device isolation pattern, the first direction is parallel to a bottom surface of the substrate; a bit line that extends in a second direction on the active pattern, the second direction intersects the first direction; a storage node contact on the active pattern; a landing pad on the storage node contact; and a fence pattern on the word line and a lateral surface of the landing pad. The fence pattern may include a lower fence pattern on a lateral surface of the bit line; and an upper fence pattern on the lower fence pattern and that protrudes in the first direction beyond the lower fence pattern.

According to some embodiments of the present inventive concepts, a semiconductor device may include an active pattern on a substrate and surrounded by a device isolation pattern in plan view; a word line that extends in a first direction and is on the active pattern and the device isolation pattern, the first direction is parallel to a bottom surface of the substrate; a bit line that extends in a second direction on the active pattern, the second direction intersects the first direction; a storage node contact on the active pattern; a landing pad on the storage node contact; a fence pattern on the word line and a lateral surface of the landing pad; and a filling pattern on the bit line and extending in the second direction. A top surface of the fence pattern may be substantially a same height as a top surface of the filling pattern.

DETAILED DESCRIPTION

It will be hereinafter discussed a semiconductor device according to some embodiments of the present inventive concepts in conjunction with the accompanying drawings.

Figure 1:
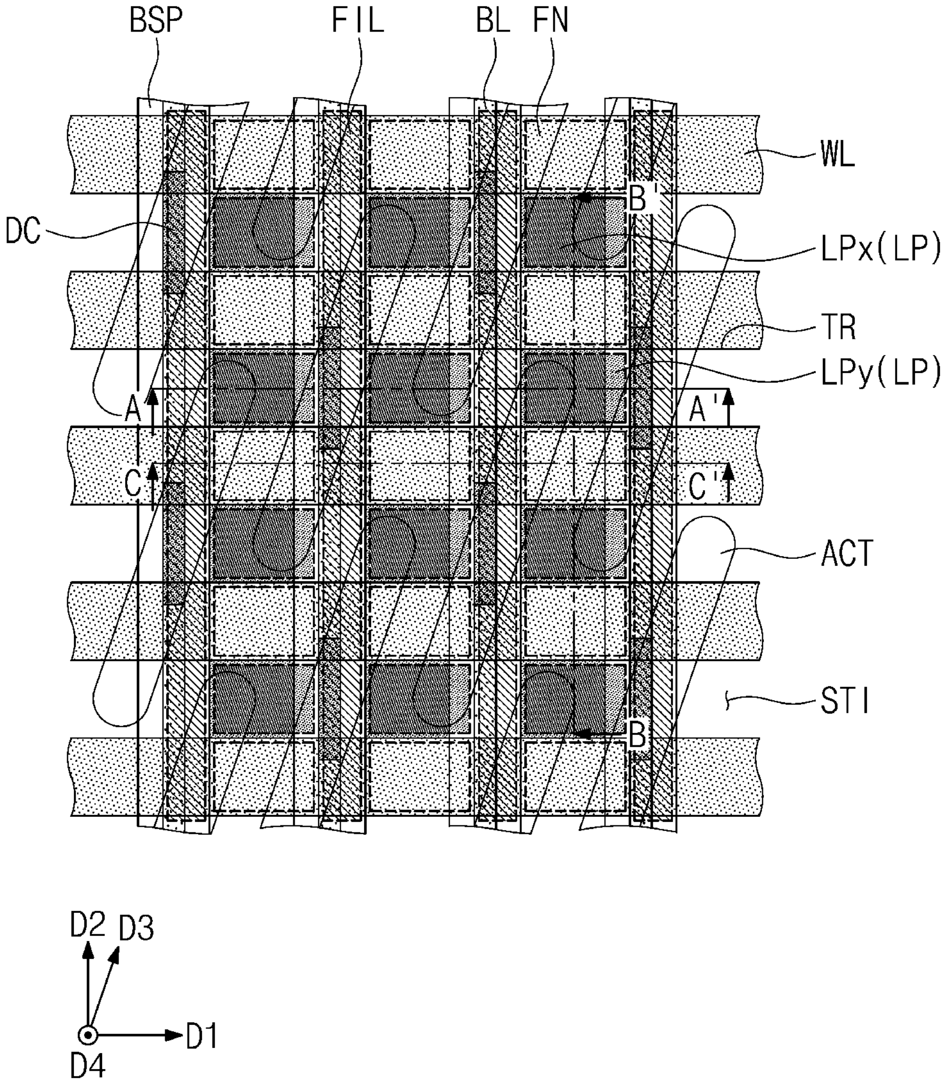
FIG. 1 illustrates a plan view showing a semiconductor device according to some embodiments of the present inventive concepts.
Figure 2A:
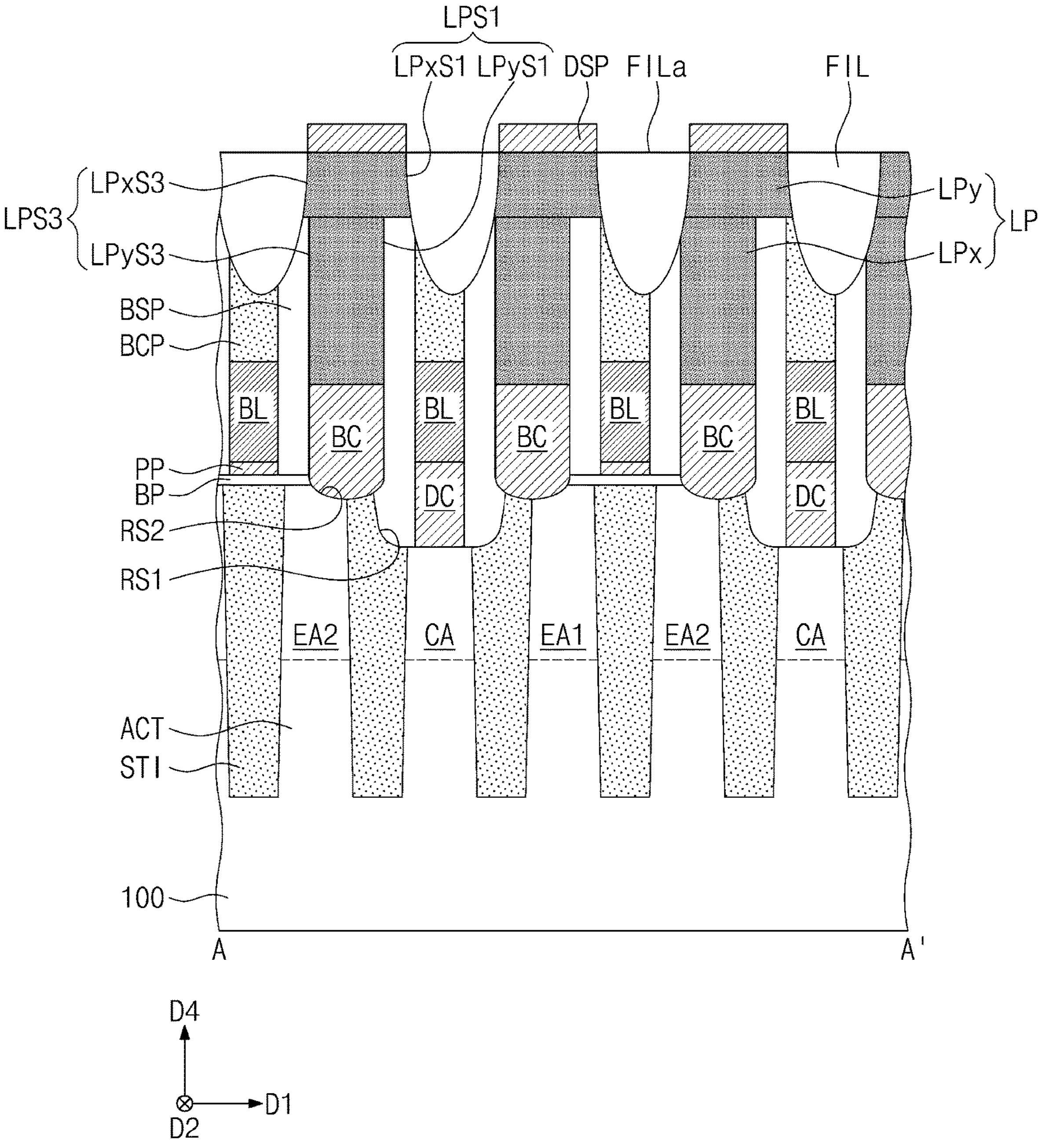
FIGS. 2A, 2B, and 2C illustrate cross-sectional views respectively taken along lines A-A', B-B', and C—C' of FIG. 1.
Figure 2B:
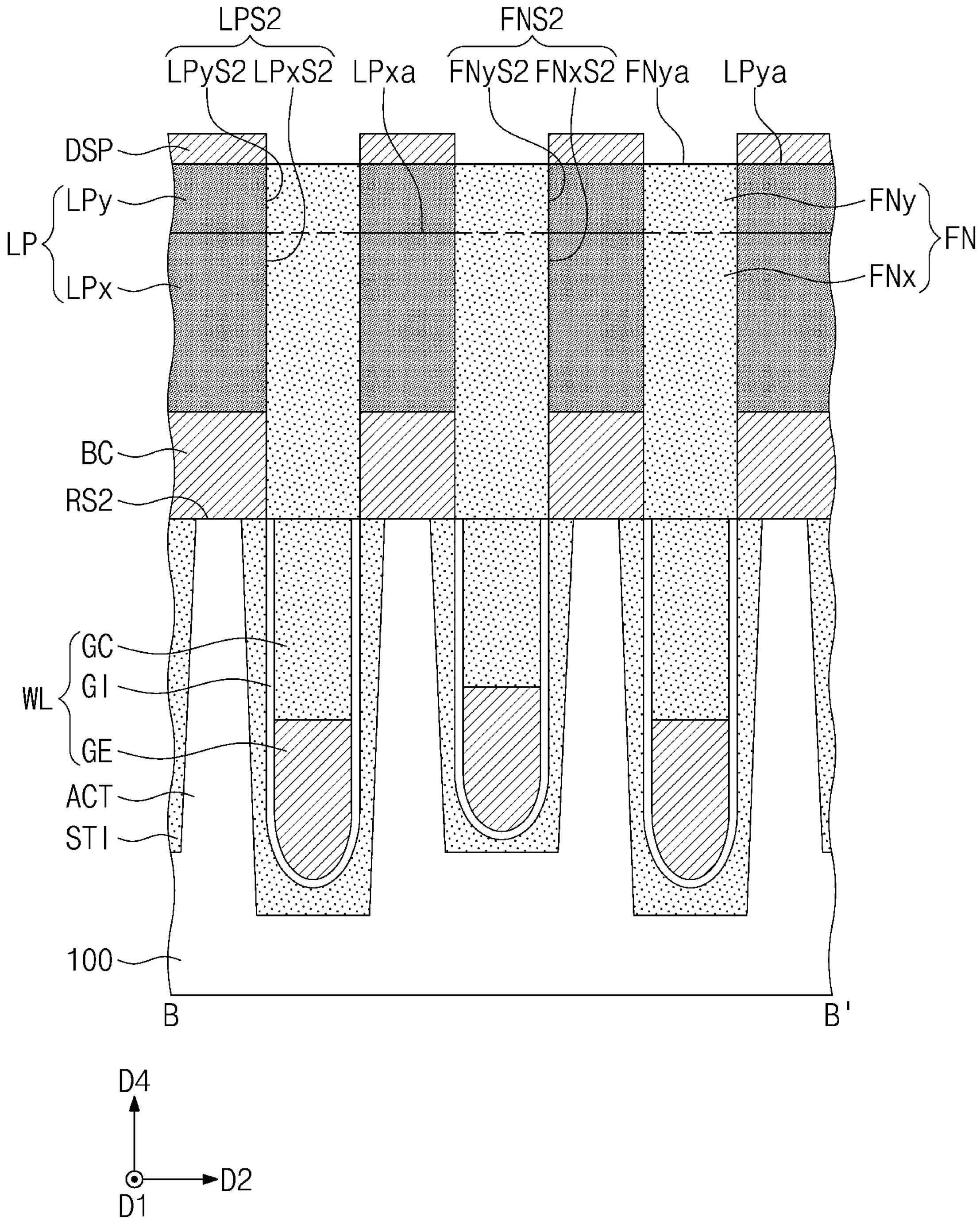
Figure 2C:
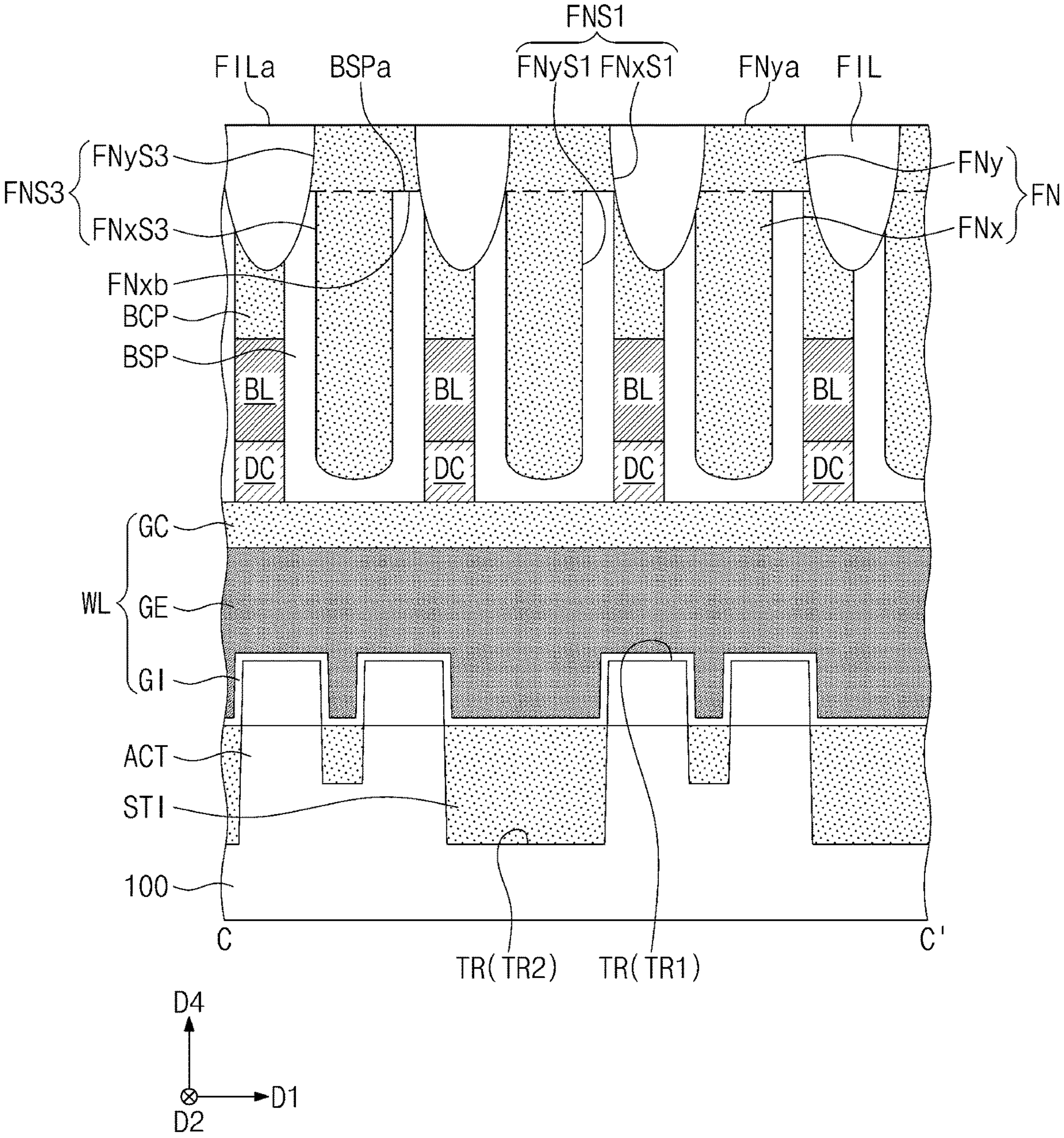

FIG. 1 illustrates a plan view showing a semiconductor device according to some embodiments of the present inventive concepts. FIGS. 2A, 2B, and 2C illustrate cross-sectional views respectively taken along lines A-A', B—B', and C—C' of FIG. 1.

Referring to FIGS. 1 to 2C, a substrate 100 may be provided. The substrate 100 may be a semiconductor substrate, for example, a silicon substrate, a germanium substrate, or a silicon-germanium substrate.

The substrate 100 may be provided thereon with a device isolation pattern STI that defines an active pattern ACT. The active pattern ACT may be provided in plural. For example, the active patterns ACT may include portions of the substrate 100 that are surrounded by the device isolation pattern STI. For convenience of description, unless otherwise specifically stated in this disclosure, the substrate 100 may be defined to indicate another portion other than the portions of the substrate 100.

The active patterns ACT may be parallel to a bottom surface of the substrate 100, and may be spaced apart from each other in a first direction D1 and a second direction D2 that intersect each other. The active patterns ACT may have island shapes that are separated from each other, and may each have a bar shape elongated in a third direction D3 parallel to the bottom surface of the substrate 100. The first, second, and third directions D1, D2, and D3 may intersect each other. The active patterns ACT may have a shape that protrudes in a fourth direction D4 perpendicular to the bottom surface of the substrate 100.

The device isolation pattern STI may include a dielectric material, such as at least one of silicon oxide ($SiO_2$) and/or silicon nitride (SiN). The device isolation pattern STI may be a single layer formed of a single material or a multiple layer including two or more materials. In this disclosure, each of the languages "A or B", "at least one of A and B", "at least one A or B", "A, B, or C", "at least one of A, B, and C", and "at least one A, B, or C" may include one or any possible combination of elements listed in a corresponding one of the expressions mentioned above.

The active pattern ACT may include a first edge part EA1 and a second edge part EA2 that are spaced apart from each other in the third direction D3, and may also include a central part CA between the first edge part EA1 and the second edge part EA2. The first edge part EA1 and the second edge part EA2 may be opposite ends in the third direction D3 of the active pattern ACT. The central part CA may be a portion of the active pattern ACT interposed between the first and second edge parts EA1 and EA2, and for example, may be a portion of the active pattern ACT interposed between a pair of word lines WL which will be discussed below. The first and second edge parts EA1 and EA2 and the central part CA may be doped with impurities (e.g., n-type or p-type impurities).

A word line WL may run across, extend on, or be on the active patterns ACT and the device isolation pattern STI. The word line WL may be provided in plural. The word lines WL may be spaced apart from each other in the second direction D2. For example, a pair of word lines WL that neighbor each other in the second direction D2 may run across or overlap one active pattern ACT in a direction perpendicular to the substrate 100. The word lines WL may be correspondingly positioned in trench regions TR provided in the active patterns ACT and the device isolation pattern STI.

Each of the word lines WL may include a gate electrode GE, a gate dielectric pattern GI, and a gate capping pattern GC. The gate electrode GE may penetrate in the first direction D1 through the active patterns ACT and the device isolation pattern STI. The gate dielectric pattern GI may be interposed between the gate electrode GE and the active patterns ACT and between the gate electrode GE and the device isolation pattern STI. The gate electrode GE may be provided thereon with the gate capping pattern GC that covers or overlaps a top surface of the gate electrode GE. The gate electrode GE may include a conductive material. For example, the gate electrode GE may be a single layer formed of one material or a multiple layer formed of two or more materials. For example, the gate dielectric pattern GI may include at least one of silicon oxide ($SiO_2$) and/or high-k dielectric materials. In this disclosure, the high-k dielectric material may be defined to indicate a material whose dielectric constant is greater than that of silicon oxide. For example, the gate capping pattern GC may include silicon nitride (SiN).

A buffer pattern BP may be provided on the substrate 100. The buffer pattern BP may cover or overlap the active patterns ACT and the device isolation pattern STI. The buffer pattern BP may be a single layer or a multiple layer. For example, the buffer pattern BP may include at least one of silicon oxide ($SiO_2$), silicon nitride (SiN), and/or silicon oxynitride (SiON).

First recess RS1 may be formed on upper portions of the active patterns ACT and an upper portion of the device isolation pattern STI adjacent to the upper portion of each of the active patterns ACT.

A bit-line contact DC may be provided in the first recess RS1. The bit-line contact DC may be interposed between the central part CA of the active pattern ACT and a bit line BL which will be discussed below. The bit-line contact DC may be provided in plural. The bit-line contacts DC may be spaced apart from each other in the first direction D1 and the second direction D2. The bit-line contact DC may electrically connect a corresponding bit line BL to the central part CA of a corresponding active pattern ACT. For example, the bit-line contact DC may include at least one of impurity-doped polysilicon, impurity-undoped polysilicon, and/or a metallic material (e.g., Ti, Mo, W, Cu, Al, Ta, Ru, or Ir).

A bit line BL may be provided on the bit-line contact DC. The bit line BL may extend in the second direction D2 on the bit-line contact DC. The bit line BL may be provided in plural. The bit lines BL may be spaced apart from each other in the first direction D1. For example, the bit line BL may include a metallic material, such as Ti, Mo, W, Cu, Al, Ta, Ru, or Ir. The bit line BL may include a material with grains formed in the same crystallographic direction. For example, the bit line BL may include a material with a single crystal, but the present inventive concepts are not limited thereto. For example, the bit line BL include a polycrystalline material with multiple grains, and the crystal orientations of the multiple grains may be similar or practically identical.

A first barrier pattern (not shown) may further be interposed between the bit line BL and the bit-line contact DC and between the bit line BL and a polysilicon pattern PP which will be discussed below. The first barrier pattern may prevent diffusion of a material between the bit line BL and the bit-line contact DC and between the bit line BL and a polysilicon pattern PP which will be discussed below. For example, the first barrier pattern may include metal nitride (e.g., nitride of Ti, Mo, W, Cu, Al, Ta, Ru, or Ir).

A polysilicon pattern PP may be provided between the bit line BL and the buffer pattern BP and between the bit-line contacts DC that neighbor each other in the second direction D2. The polysilicon pattern PP may be provided in plural. For example, the polysilicon patterns PP may be spaced apart from each other in the first direction D1 and the second direction D2. A top surface of the polysilicon pattern PP and a top surface of the bit-line contact DC may be located at substantially the same level or height with respect to a top surface of the substrate 100 and may be coplanar with each other. The polysilicon pattern PP may include, for example, impurity-doped polysilicon.

A bit-line capping pattern BCP may be provided on the bit line BL. The bit-line capping pattern BCP may extend in the second direction D2 together with the bit line BL. The bit-line capping pattern BCP may be provided in plural. The bit-line capping patterns BCP may be spaced apart from each other in the first direction D1. The bit-line capping pattern BCP may vertically overlap the bit line BL. The bit-line capping pattern BCP may be formed of a single layer or a plurality of layers. The bit-line capping pattern BCP may include a first capping pattern, a second capping pattern, and a third capping pattern that are sequentially stacked. For example, each of the first to third capping patterns may include silicon nitride (SiN). In some embodiments, the bit-line capping pattern BCP may include four or more stacked capping patterns.

A bit-line spacer BSP may be provided on a lateral surface of the bit-line contact DC, a lateral surface of the bit line BL, and a lateral surface of the bit-line capping pattern BCP. The bit-line spacer BSP may extend in the second direction D2 on the lateral surface of the bit line BL. The bit-line spacer BSP may fill or be in the first recess RS1, and may extend in the fourth direction D4 on the lateral surface of the bit-line capping pattern BCP. The bit-line spacer BSP may be provided in plural. The bit-line spacers BSP may be spaced apart from each other in the first direction D1. For example, the bit-line spacer BSP may include at least one of silicon oxide ($SiO_2$), silicon nitride (SiN), silicon carbonitride (SiOC), and/or silicon oxycarbonitride (SiOCN).

The bit-line spacer BSP may include one spacer or a plurality of spacers. For example, first to third spacers may be sequentially provided on the lateral surface of the bit line BL. The second spacer may include an air gap that separates the first and third spacers from each other.

A storage node contact BC may be provided between the bit lines BL that neighbor each other in the first direction D1. The storage node contact BC may be provided in plural. The storage node contacts BC may be spaced apart from each other in the first and second directions D1 and D2. The storage node contacts BC that neighbor each other in the first direction D1 may be spaced apart from each other across the bit line BL. The storage node contacts BC that neighbor each other in the second direction D2 may be spaced apart from each other across a fence pattern FN which will be discussed below. Each of the storage node contacts BC may fill a second recess RS2 provided in a corresponding one of the first and second edge parts EA1 and EA2 of the active pattern ACT, and may be connected to the corresponding edge part. For example, the storage node contact BC may include at least one of impurity-doped polysilicon, impurity-undoped polysilicon, and/or a metallic material (e.g., Ti, Mo, W, Cu, Al, Ta, Ru, or Ir).

A fence pattern FN may be interposed between the bit lines BL that neighbor each other in the first direction D1 on the word line WL. The fence pattern FN may be interposed between the storage node contacts BC that neighbor each other in the second direction D2 on the word line WL. The fence pattern FN may be provided in plural. The fence patterns FN may be spaced apart from each other in the first and second directions D1 and D2. The fence patterns FN that neighbor each other in the first direction D1 may be spaced apart from each other across the bit line BL. The fence patterns FN that neighbor each other in the second direction D2 may be spaced apart from each other across the storage node contact BC. The fence pattern FN may include, for example, at least one of silicon oxide ($SiO_2$), silicon nitride (SiN), silicon carbonitride (SiOC), and/or silicon oxycarbonitride (SiOCN).

The fence pattern FN may include a lower fence pattern FNx and an upper fence pattern FNy that are distinguished from each other with no interface. The upper fence pattern FNy may protrude in the first direction D1 more than the lower fence pattern FNx. A bottom surface FNxb of the upper fence pattern FNy may be in contact with a top surface BSPa of the bit-line spacer BSP.

The fence pattern FN may have a first lateral surface FNS1 directed in the first direction D1, a second lateral surface FNS2 directed in the second direction D2 or its opposite direction, and a third lateral surface FNS3 opposite to the first lateral surface FNS1. The first lateral surface FNS1 of the fence pattern FN may include a first lateral surface FNxS1 of the lower fence pattern FNx and a first lateral surface FNyS1 of the upper fence pattern FNy. The second lateral surface FNS2 of the fence pattern FN may include a second lateral surface FNxS2 of the lower fence pattern FNx and a second lateral surface FNyS2 of the upper fence pattern FNy. The third lateral surface FNS3 of the fence pattern FN may include a third lateral surface FNxS3 of the lower fence pattern FNx and a third lateral surface FNyS3 of the upper fence pattern FNy. The first lateral surface FNyS1 of the upper fence pattern FNy may protrude in the first direction D1 more than the first lateral surface FNxS1 of the lower fence pattern FNx.

A second barrier pattern (not shown) may conformally cover or overlap the bit-line spacer BSP and the storage node contact BC. For example, the second barrier pattern may include metal nitride (e.g., nitride of Ti, Mo, W, Cu, Al, Ta, Ru, or Ir). An ohmic pattern (not shown) may further be interposed between the second barrier pattern and the storage node contact BC. For example, the ohmic pattern may include metal silicide (e.g., silicide of Ti, Mo, W, Cu, Al, Ta, Ru, or Ir).

A landing pad LP may be provided on the storage node contact BC. The landing pad LP may be electrically connected through a corresponding storage node contact BC to one of the first and second edge parts EA1 and EA2 of a corresponding active pattern ACT.

The landing pad LP may include a lower landing pad LPx and an upper landing pad LPy that are sequentially provided on the storage node contact BC. The lower landing pad LPx and the upper landing pad LPy may be distinguished from each other with an interface and may be in contact with each other.

The lower landing pad LPx may be provided on the second lateral surface FNxS2 of the lower fence pattern FNx. The lower landing pad LPx may be interposed between the bit-line capping patterns BCP that neighbor each other in the first direction D1. The lower landing pad LPx may be interposed between the lower fence patterns FNx that neighbor each other in the second direction D2. The lower landing pad LPx may be provided in plural. The lower landing pads LPx may be spaced apart from each other in the first and second directions D1 and D2. The lower landing pads LPx that neighbor each other in the first direction D1 may be spaced apart from each other across the bit-line capping pattern BCP. The lower landing pads LPx that neighbor each other in the second direction D2 may be spaced apart from each other across the lower fence pattern FNx. A top surface LPxa of the lower landing pad LPx may be located at a level lower than that of a top surface FNya of the upper fence pattern FNy and substantially the same as that of the bottom surface FNyb of the upper fence pattern FNy. In other words, the top surface LPxa of the lower landing pad LPx may be at a lower height than a top surface FNya of the upper fence pattern FNy and substantially the same height as the bottom surface FNyb of the upper fence pattern FNy, with respect to a top surface of the substrate 100. The lower landing pad LPx may have a uniform width in the second direction D2. For example, the width in the second direction D2 of the lower landing pad LPx may be substantially constant or may decrease in a downward direction.

The upper landing pad LPy may be provided on the second lateral surface FNyS2 of the upper fence pattern FNy. The upper landing pad LPy and the upper fence pattern FNy may neighbor each other in the second direction D2. The upper landing pad LPy may be located at a level higher than that of the bit-line capping pattern BCP. The upper landing pad LPy may be interposed between subsequently described filling patterns FIL that neighbor each other in the first direction D1. The upper landing pad LPy may be interposed between the upper fence patterns FNy that neighbor each other in the second direction D2. The upper landing pad LPy may be provided in plural. The upper landing pads LPy may be spaced apart from each other in the first and second directions D1 and D2. The upper landing pads LPy that neighbor each other in the first direction D1 may be spaced apart from each other across the filling pattern FIL or with the filling pattern FIL therebetween. The upper landing pads LPy that neighbor each other in the second direction D2 may be spaced apart from each other across the upper fence pattern FNy. When viewed in plan, the upper landing pads LPy may be linearly disposed along the first direction D1 between the word lines WL that neighbor each other in the second direction D2. The upper landing pads LPy may be linearly disposed along the second direction D2 between the filling patterns FIL that neighbor each other in the first direction D1.

A top surface LPya of the upper landing pad LPy may be located at a level or height substantially the same as that of the top surface FNya of the upper fence pattern FNy with respect to a top surface of the substrate. The upper landing pad LPy may protrude in the first direction D1 more than the lower landing pad LPx.

For example, neither the lower landing pad LPx nor the upper landing pad LPy may be recessed in the second direction D2 with respect to the filling pattern FIL which will be discussed below. When viewed in the second direction D2, a bottom surface of the upper landing pad LPy may have a width substantially the same as a width of the top surface LPxa of the lower landing pad LPx. When viewed in second direction D2, the upper landing pad LPy may vertically overlap and completely cover or completely overlap the top surface LPxa of the lower landing pad LPx. Therefore, a large contact area may be provided between the top surface LPxa of the lower landing pad LPx and the bottom surface of the upper landing pad LPy. As a result, an easy electrical connection may be achieved between the upper landing pad LPy and its corresponding lower landing pad LPx, and a semiconductor device may increase in electrical properties.

The landing pad LP may have a first lateral surface LPS1 directed in the first direction D1, a second lateral surface LPS2 directed in the second direction D2 or its opposite direction, and a third lateral surface LPS3 opposite to the first lateral surface LPS1. The first lateral surface LPS1 of the landing pad LP may include a first lateral surface LPxS1 of the lower landing pad LPx and a first lateral surface LPyS1 of the upper landing pad LPy. The second lateral surface LPS2 of the landing pad LP may include a second lateral surface LPxS2 of the lower landing pad LPx and a second lateral surface LPyS2 of the upper landing pad LPy. The third lateral surface LPS3 of the landing pad LP may include a third lateral surface LPxS3 of the lower landing pad LPx and a third lateral surface LPyS3 of the upper landing pad LPy.

The second lateral surface LPxS2 of the lower landing pad LPx may be in contact with the second lateral surface FNxS2 of the lower fence pattern FNx. The second lateral surface LPxS2 of the lower landing pad LPx may be continuously connected to the second lateral surface LPyS2 of the upper landing pad LPy. The second lateral surface LPxS2 of the lower landing pad LPx may be even. For example, the second lateral surface LPxS2 of the lower landing pad LPx may not be recessed.

The first lateral surface LPyS1 and the third lateral surface LPyS3 of the upper landing pad LPy may each be in contact with the second lateral surface LPyS2 of the upper landing pad LPy. For example, the first lateral surface LPyS1 and the third lateral surface LPyS3 of the upper landing pad LPy may each be in contact with the second lateral surface LPyS2 of the upper landing pad LPy, and at the same time a corner may be formed between the second lateral surface LPyS2 and each of the first and third laterals surfaces LPyS1 and LPyS3. The corner may be angular or may have a curvature.

A filling pattern FIL may be interposed between the upper landing pads LPy that neighbor each other in the first direction D1. The filling pattern FIL may extend in the second direction D2 on the bit line BL. A top surface FILa of the filling pattern FIL may be located at a level substantially the same as that of the top surface LPya of the upper landing pad LPy and that of the top surface FNya of the fence pattern FN. The filling pattern FIL may be adjacent in the first direction D1 to the landing pad LP and the fence pattern FN.

The filling pattern FIL may be provided in plural. The plurality of filling patterns FIL may be spaced apart from each other in the first direction D1. The filling patterns FIL that neighbor each other in the first direction D1 may be spaced apart from each other across the upper landing pad LPy or the upper fence pattern FNy, one of a pair of filling patterns FIL that neighbor each other in the first direction D1 may be in contact with the first lateral surface LPyS1 of the upper landing pad LPy and the first lateral surface FNyS1 of the upper fence pattern FNy. The other of a pair of filling patterns FIL that neighbor each other in the first direction D1 may be in contact with the third lateral surface LPyS3 of the upper landing pad LPy and the third lateral surface FNyS3 of the upper fence pattern FNy. For example, the filling pattern FIL may include at least one of silicon nitride (SiN), silicon oxide ($SiO_2$), and/or silicon oxynitride (SiON).

A data storage pattern DSP may be provided on the landing pad LP. The data storage pattern DSP may be provided in plural, and the plurality of data storage patterns DSP may be spaced apart from each other in the first and second directions D1 and D2. Each of the data storage patterns DSP may vertically overlap at least a portion of a corresponding landing pad LP. For example, each of the data storage patterns DSP may vertically overlap an entirety of a corresponding landing pad LP in a direction perpendicular to a top surface of the substrate 100. In some embodiments, each of the data storage patterns DSP may be shifted in the first direction D1 or its opposite direction more than the landing pad LP, and may vertically overlap a portion of the landing pad LP. The data storage pattern DSP may be electrically connected through a corresponding landing pad LP and a corresponding storage node contact BC to one of the first and second edge parts EA1 and EA2 of a corresponding active pattern ACT.

The data storage pattern DSP may be, for example, a capacitor including a bottom electrode, a dielectric layer, and a top electrode. In this case, a semiconductor device according to the present inventive concepts may be a dynamic random access memory (DRAM). For another example, the data storage pattern DSP may include a magnetic tunnel junction pattern. In this case, a semiconductor device according to the present inventive concepts may be a magnetic random access memory (MRAM). For another example, the data storage pattern DSP may include a phase change material or a variable resistance material. In this case, a semiconductor device according to the present inventive concepts may be a phase change random access memory (PRAM) or a resistive random access memory (ReRAM). This is, however, merely an example, and the present inventive concepts are not limited thereto. The data storage pattern DSP may include various structures and/or materials capable of storing data.

Figure 3:
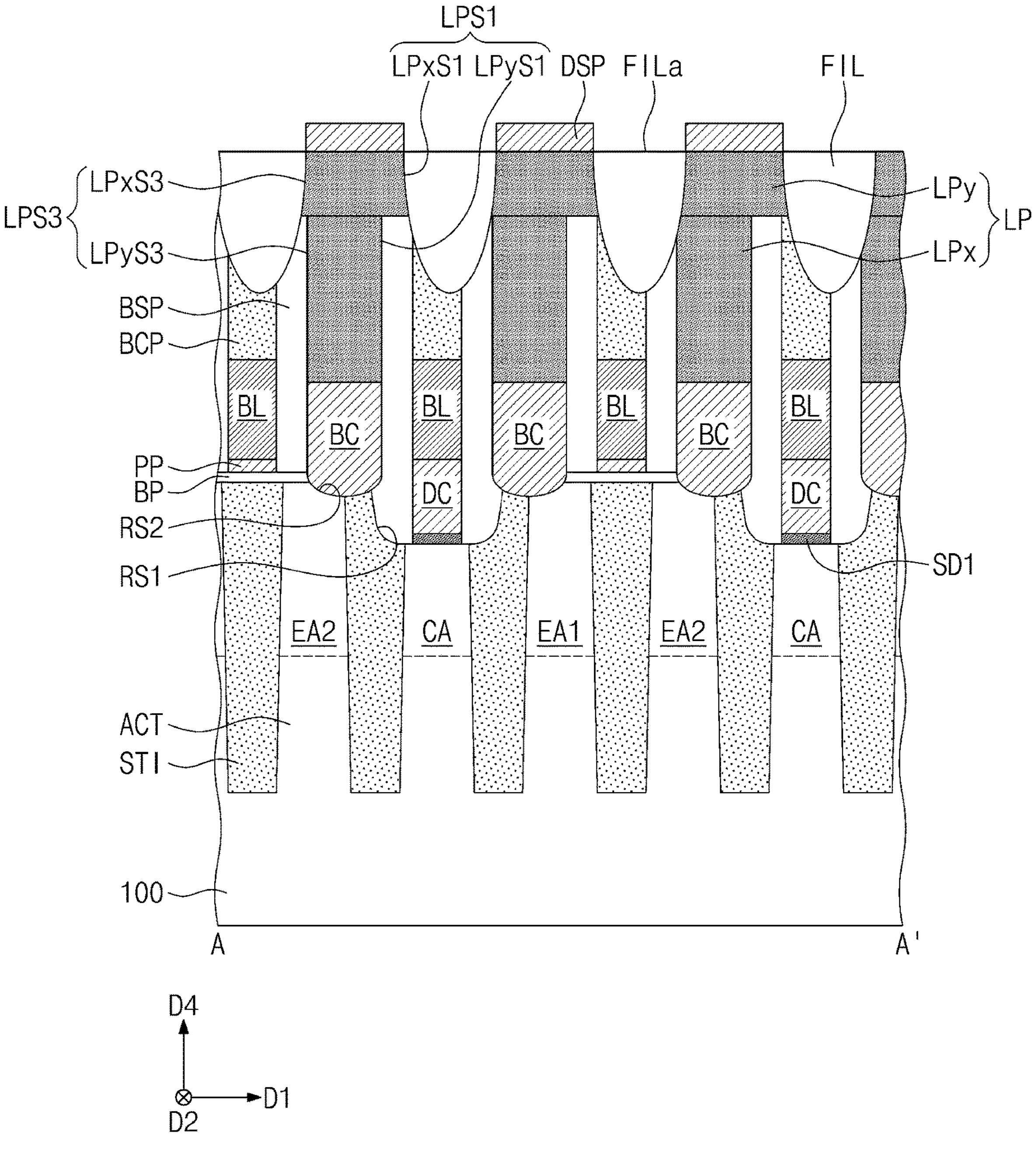
FIG. 3 illustrates a cross-sectional view taken along line A-A' of FIG. 1.
Figure 4A:
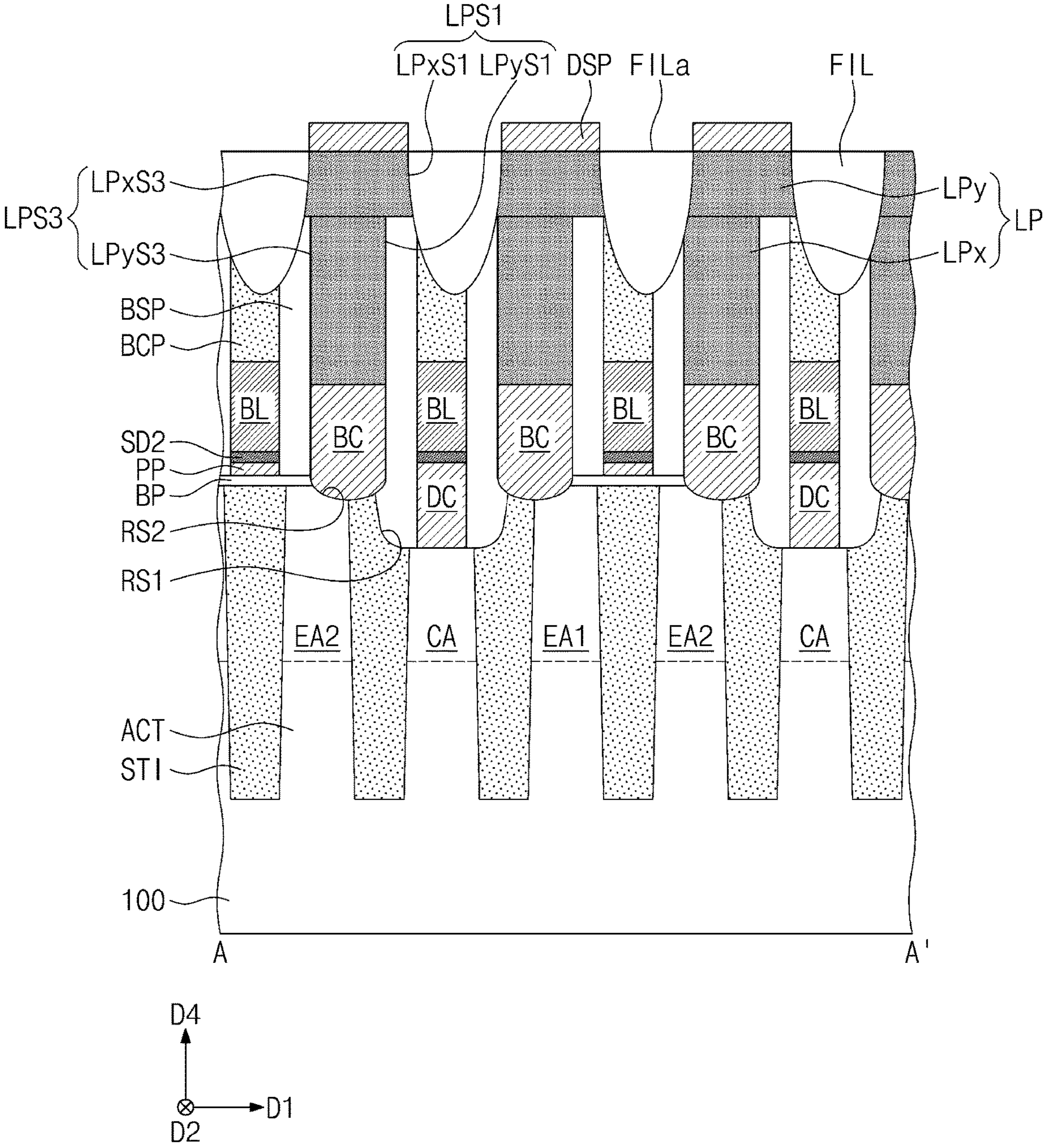
FIGS. 4A and 4B illustrate cross-sectional views taken along lines A-A' and C—C' of FIG. 1.
Figure 4B:
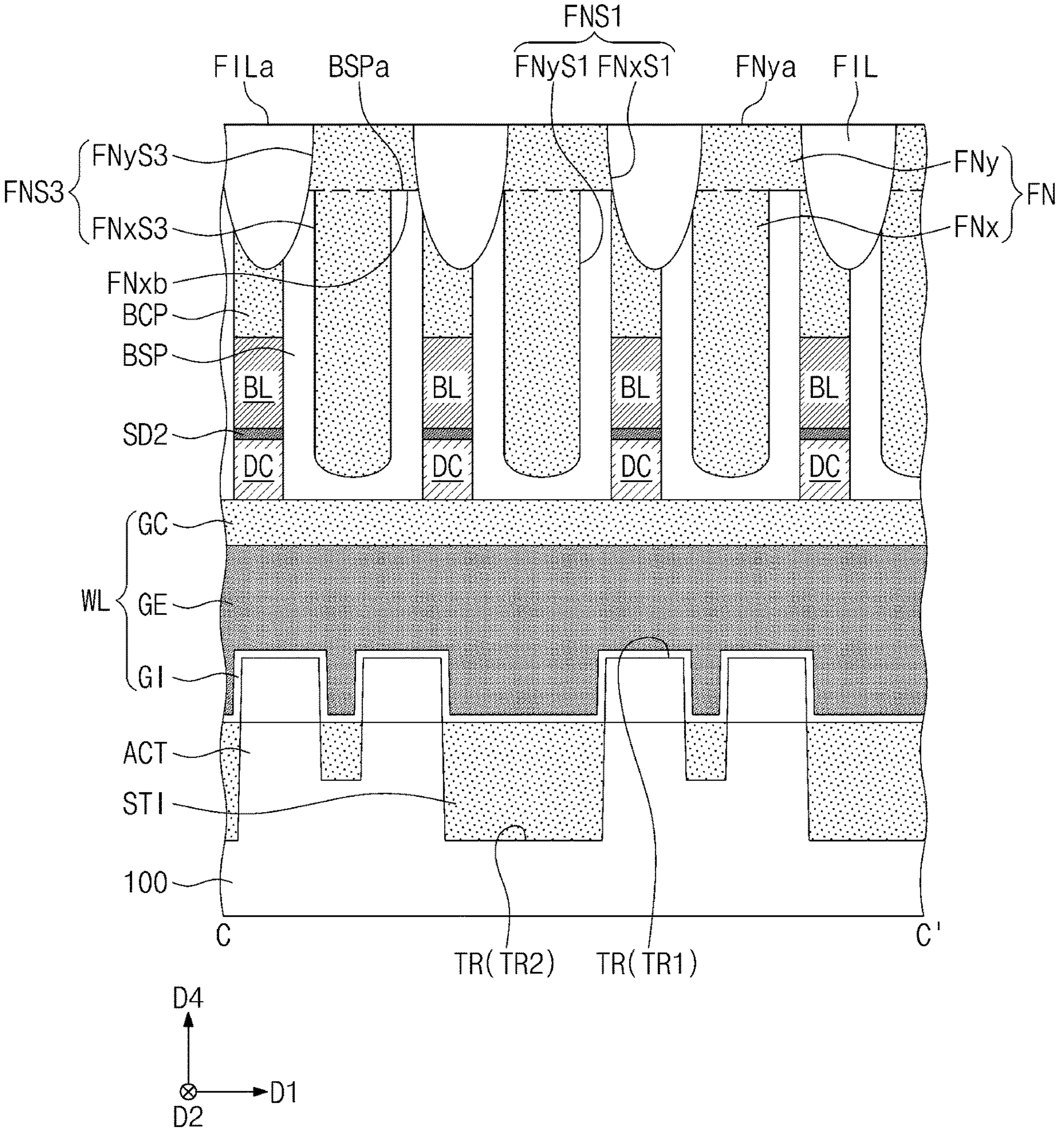

With reference to FIGS. 3 to 4B, the following will describe a semiconductor device according to some embodiments of the present inventive concepts. For brevity of description, an explanation of components repetitive to those discussed above will be omitted, and a difference thereof will be discussed in detail.

FIG. 3 illustrates a cross-sectional view taken along line A-A' of FIG. 1.

Referring to FIG. 3, a first seed pattern SD1 may be interposed between the bit-line contact DC and the active pattern ACT. In this case, the bit-line contact DC may include a metallic material, such as Ti, Mo, W, Cu, Al, Ta, Ru, or Ir. In fabricating a semiconductor device, the bit-line contact DC may be grown from the first seed pattern SD1 that serves as a seed. The first seed pattern SD1 may improve a contact resistance between the bit-line contact DC and the active pattern ACT. For example, the first seed pattern SD1 may include metal silicide (e.g., silicide of Ti, Mo, W, Cu, Al, Ta, Ru, or Ir). For example, differently from that shown, the polysilicon pattern PP may not be provided.

FIGS. 4A and 4B illustrate cross-sectional views taken along lines A-A' and C—C' of FIG. 1.

Referring to FIGS. 4A and 4B, a second seed pattern SD2 may be interposed between the bit line BL and the bit-line contact DC. In this case, the bit-line contact DC may include impurity-doped silicon or impurity-undoped silicon. The second seed pattern SD2 may further be interposed between the bit line BL and the polysilicon pattern PP. In fabricating a semiconductor device, the bit line BL may be grown from the second seed pattern SD2 that serves as a seed. The second seed pattern SD2 may improve a contact resistance between the bit line BL and the bit-line contact DC. For example, the second seed pattern SD2 may include metal silicide (e.g., silicide of Ti, Mo, W, Cu, Al, Ta, Ru, or Ir).

With reference to FIGS. 5 to 14, the following will describe a method of fabricating a semiconductor device according to some embodiments of the present inventive concepts. For brevity of description, an explanation of components repetitive to those discussed above will be omitted, and a difference thereof will be discussed in detail.

Figure 5:
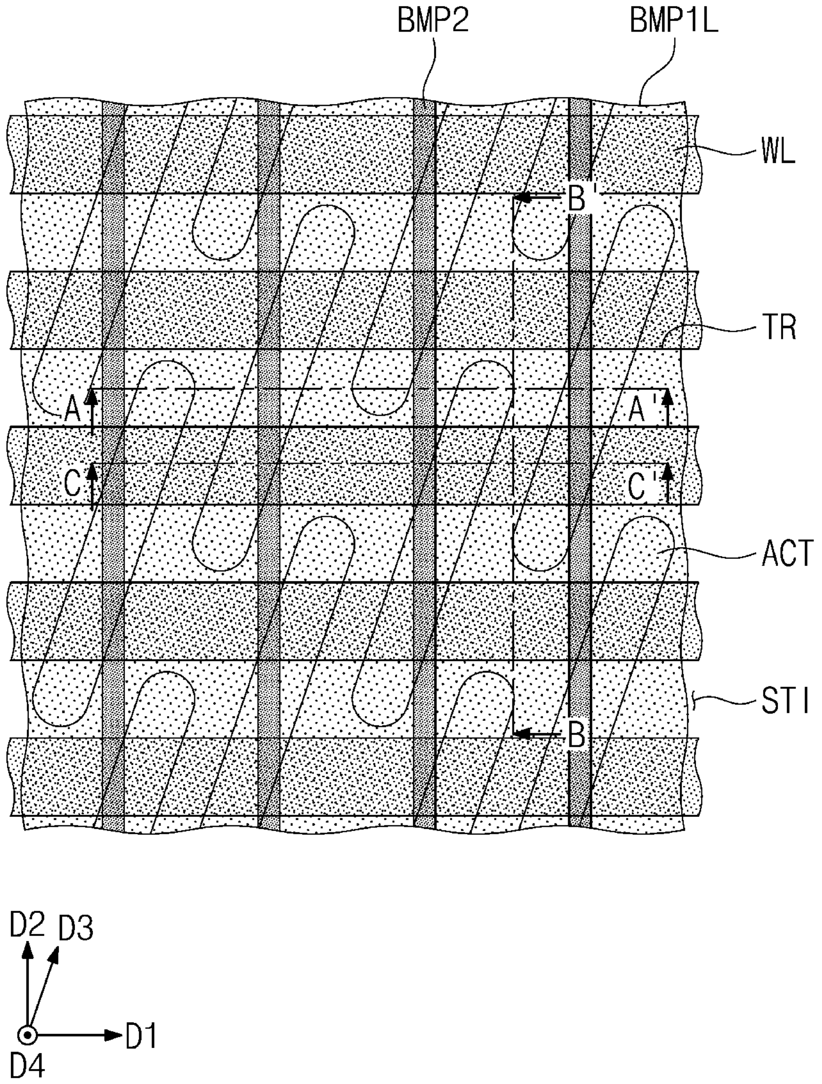
FIGS. 5, 6A, 6B, 6C, 7, 8A, 8B, 8C, 9, 10A, 10B, and 10C illustrate plan and cross-sectional views showing a method of fabricating a semiconductor device according to some embodiments of the present inventive concepts.
Figure 6A:
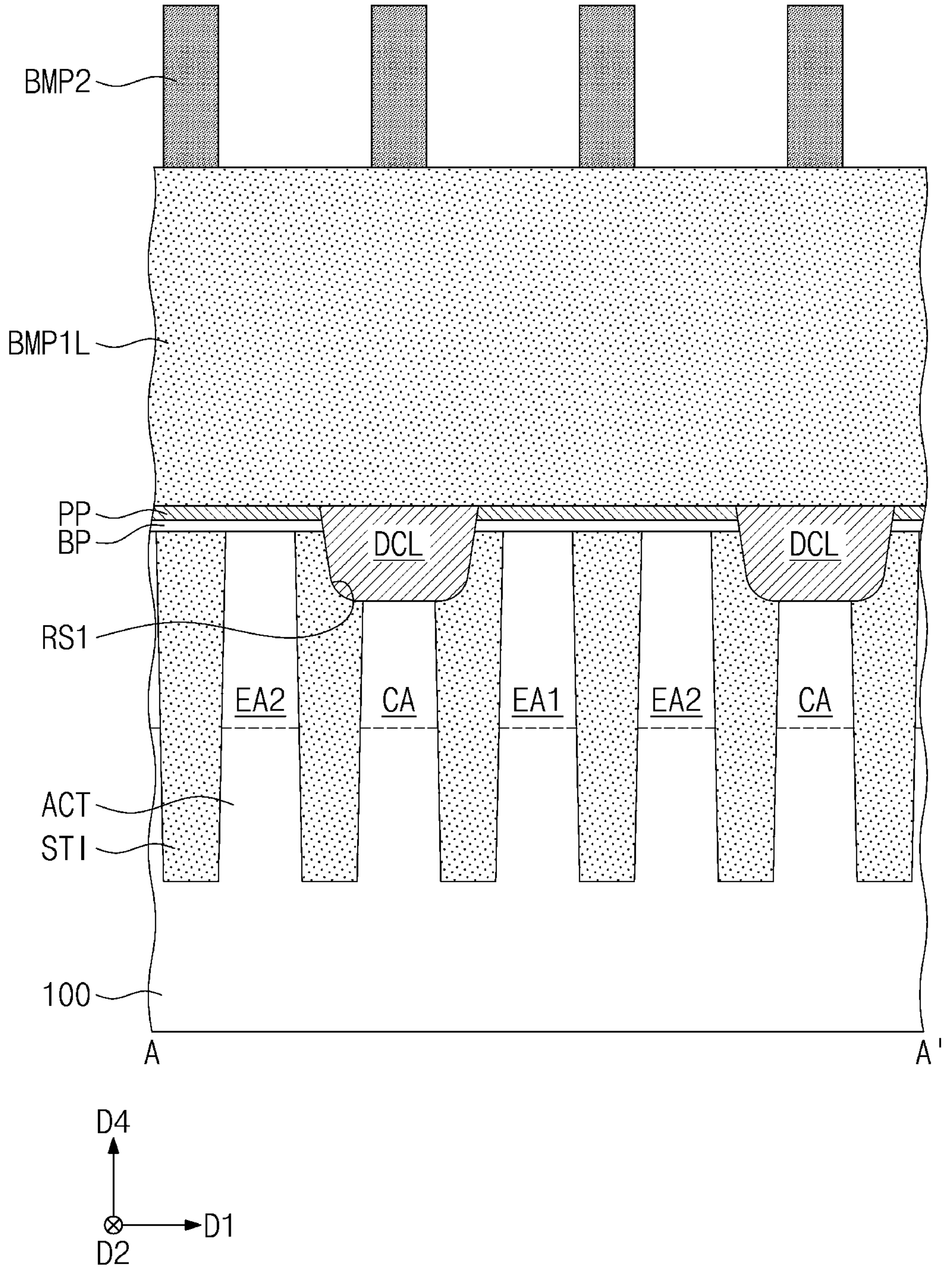
Figure 6B:
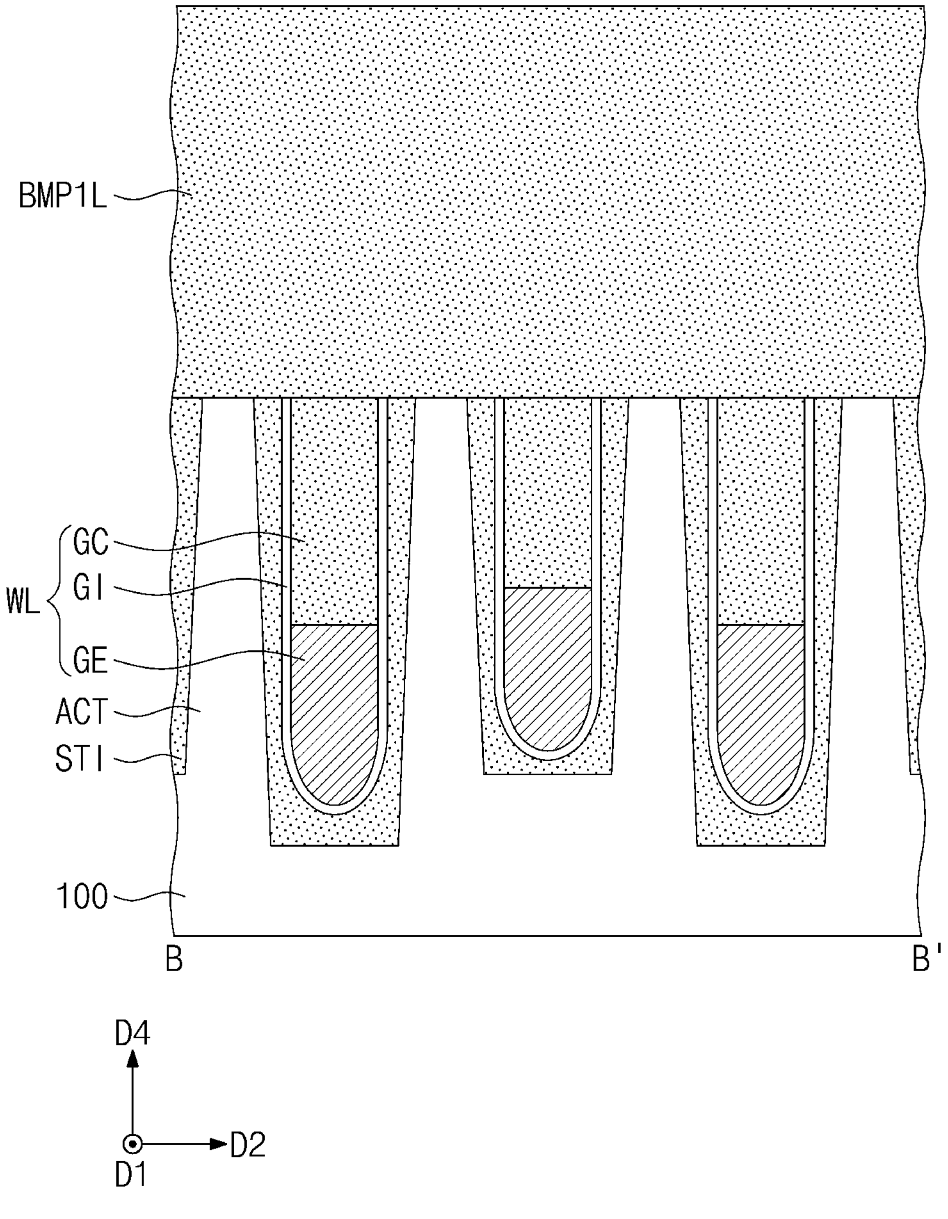
Figure 6C:
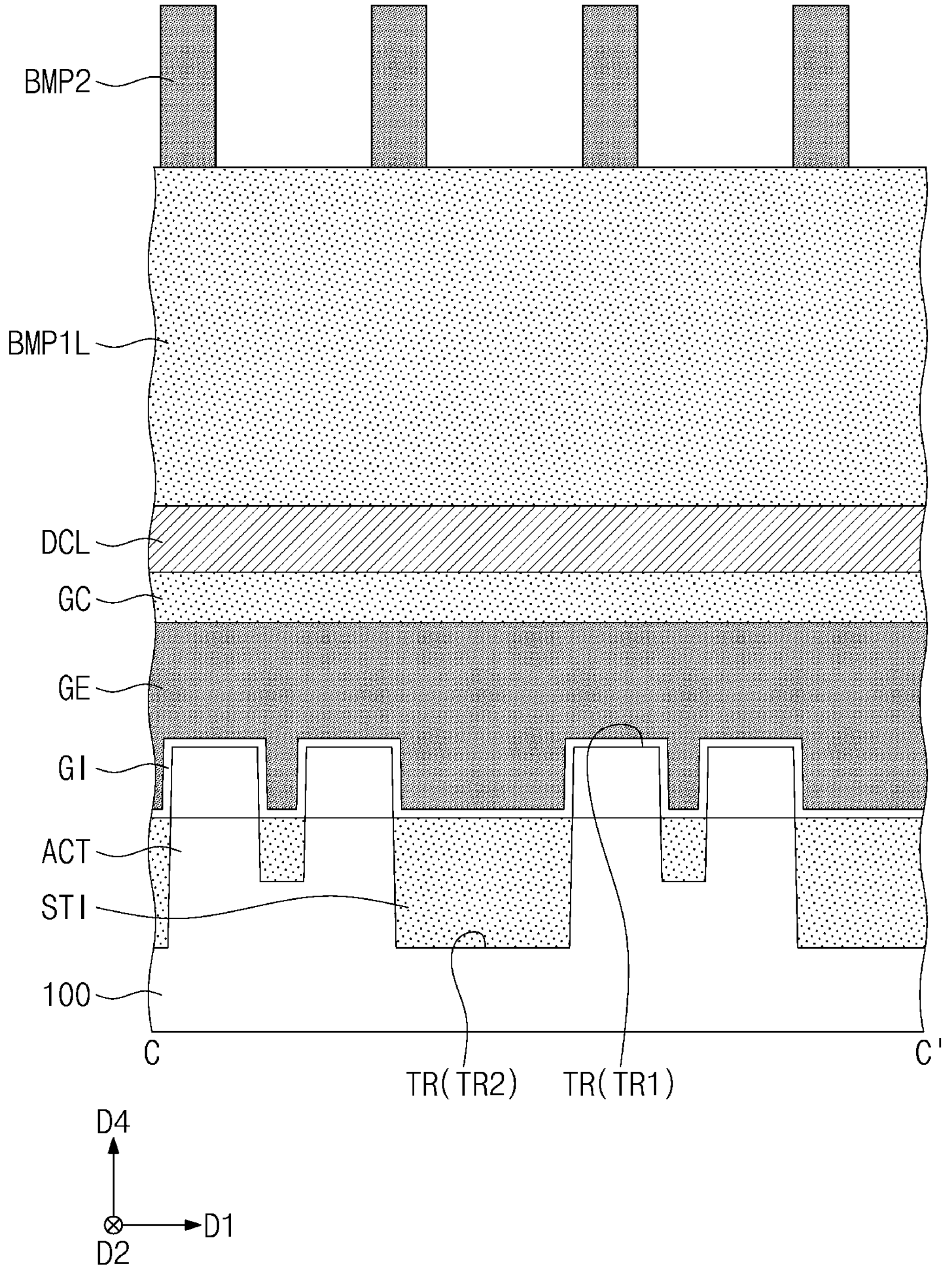
Figure 7:
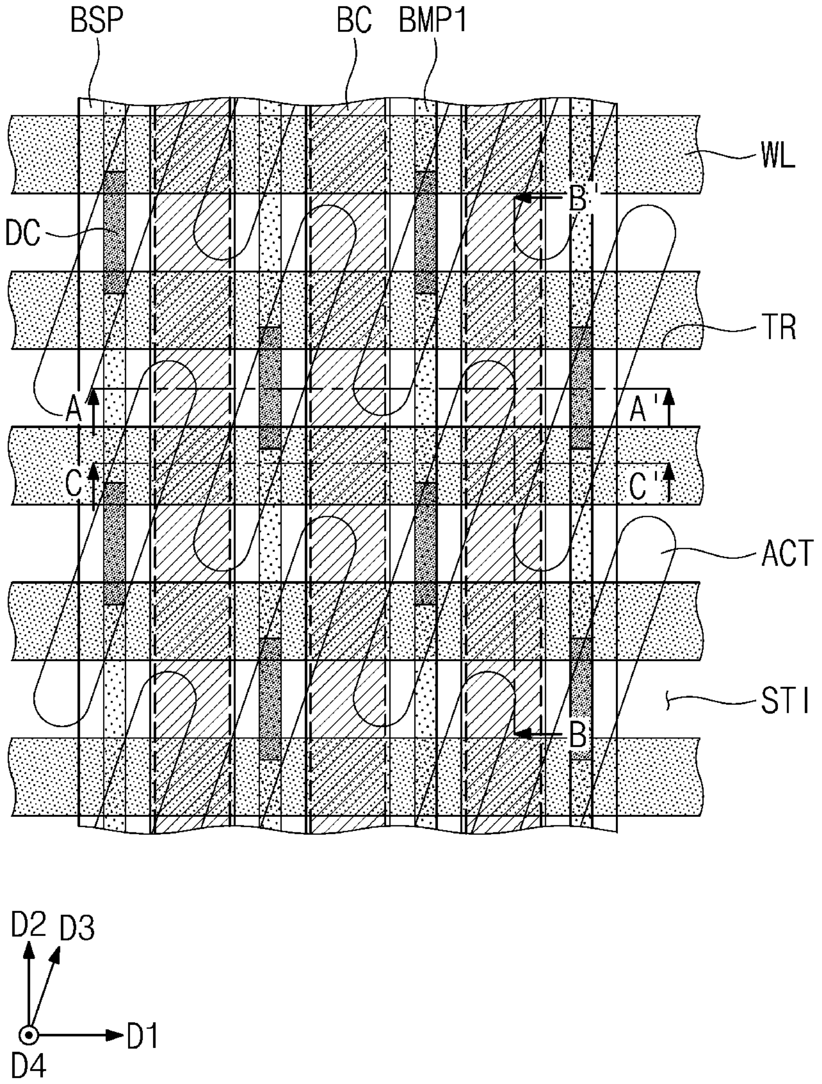
Figure 8A:
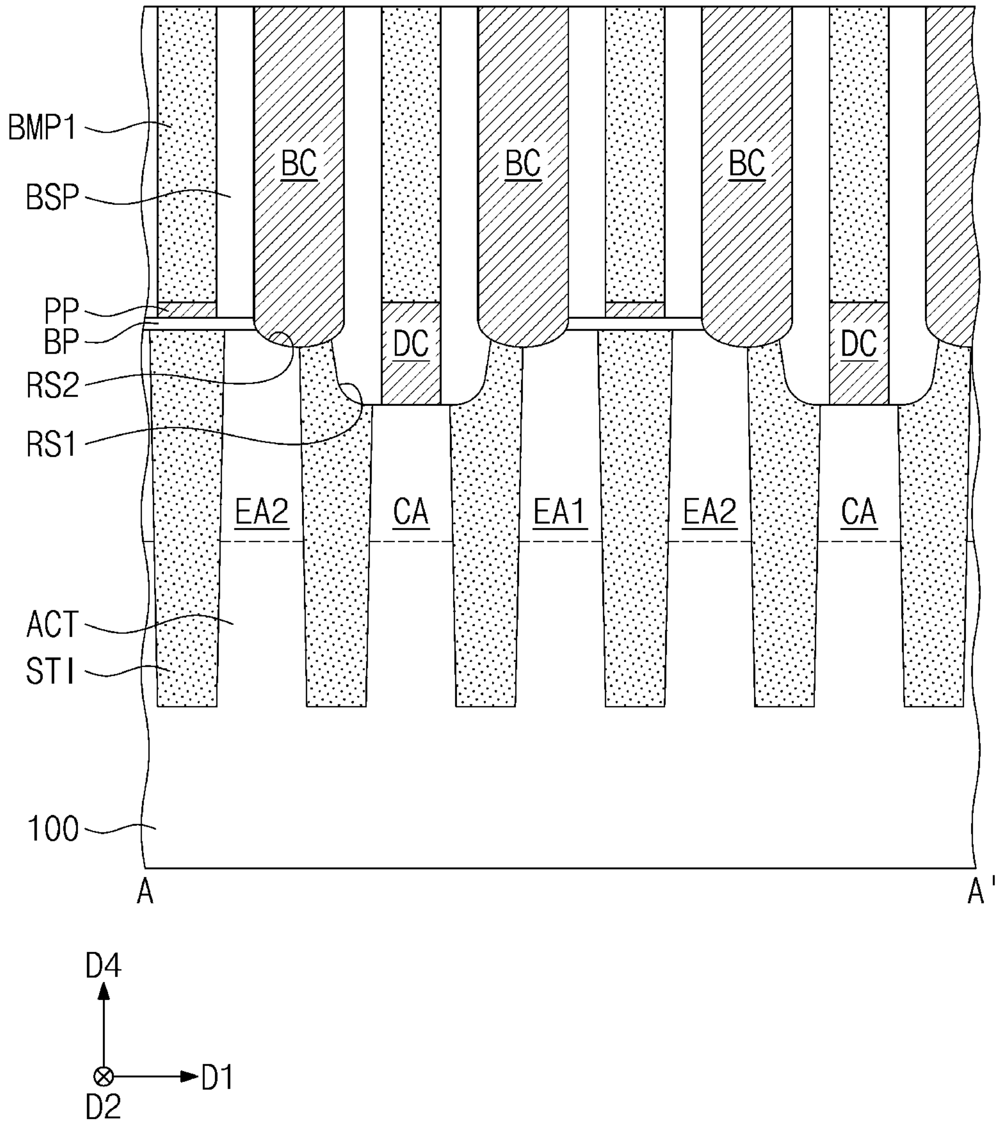
Figure 8B:
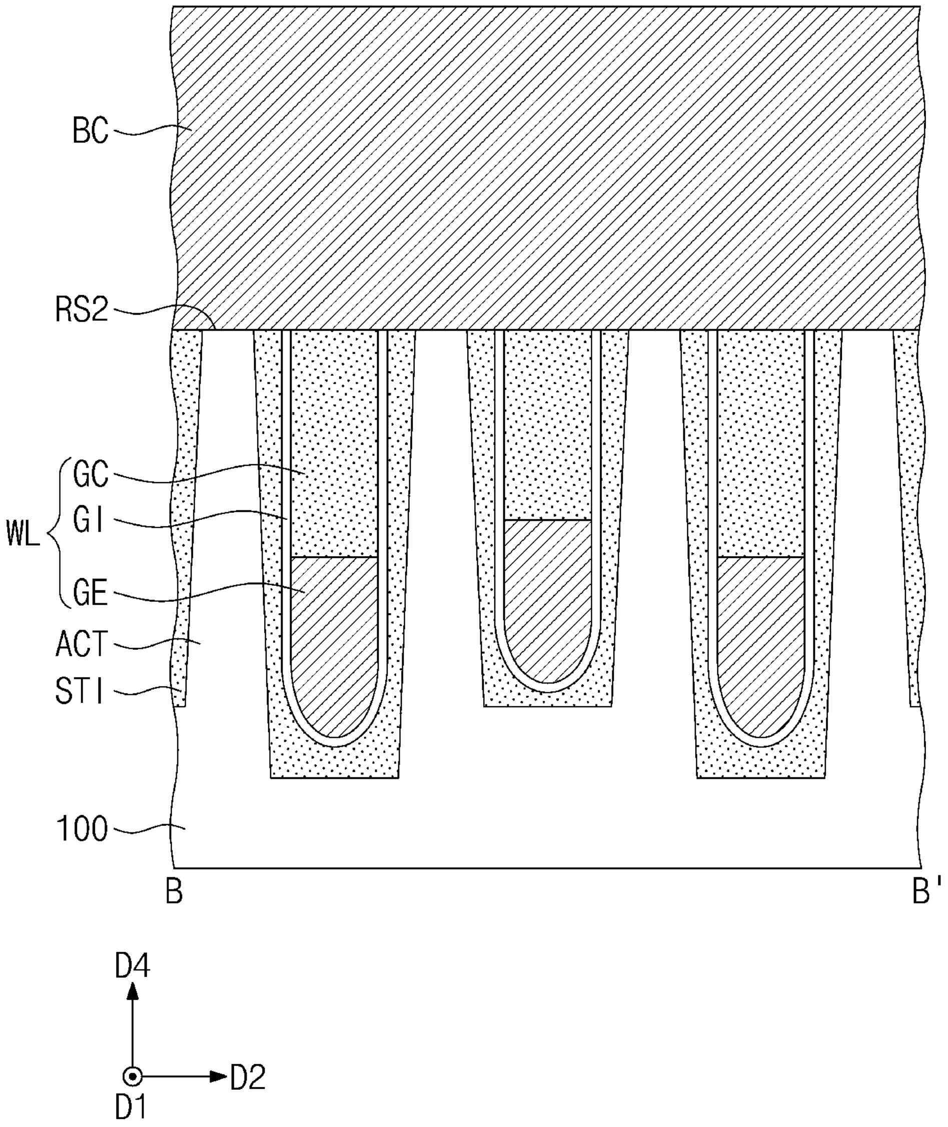
Figure 8C:
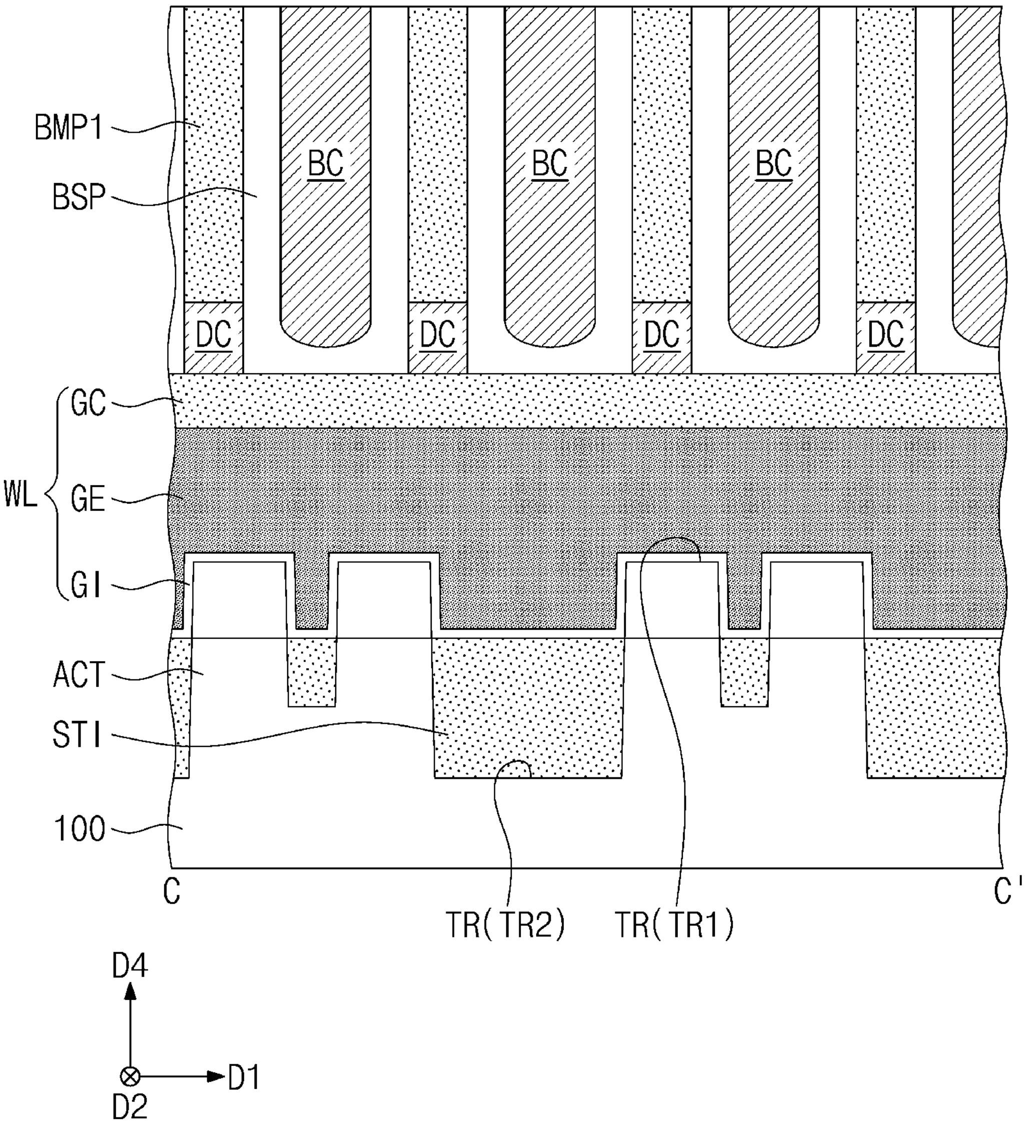
Figure 9:
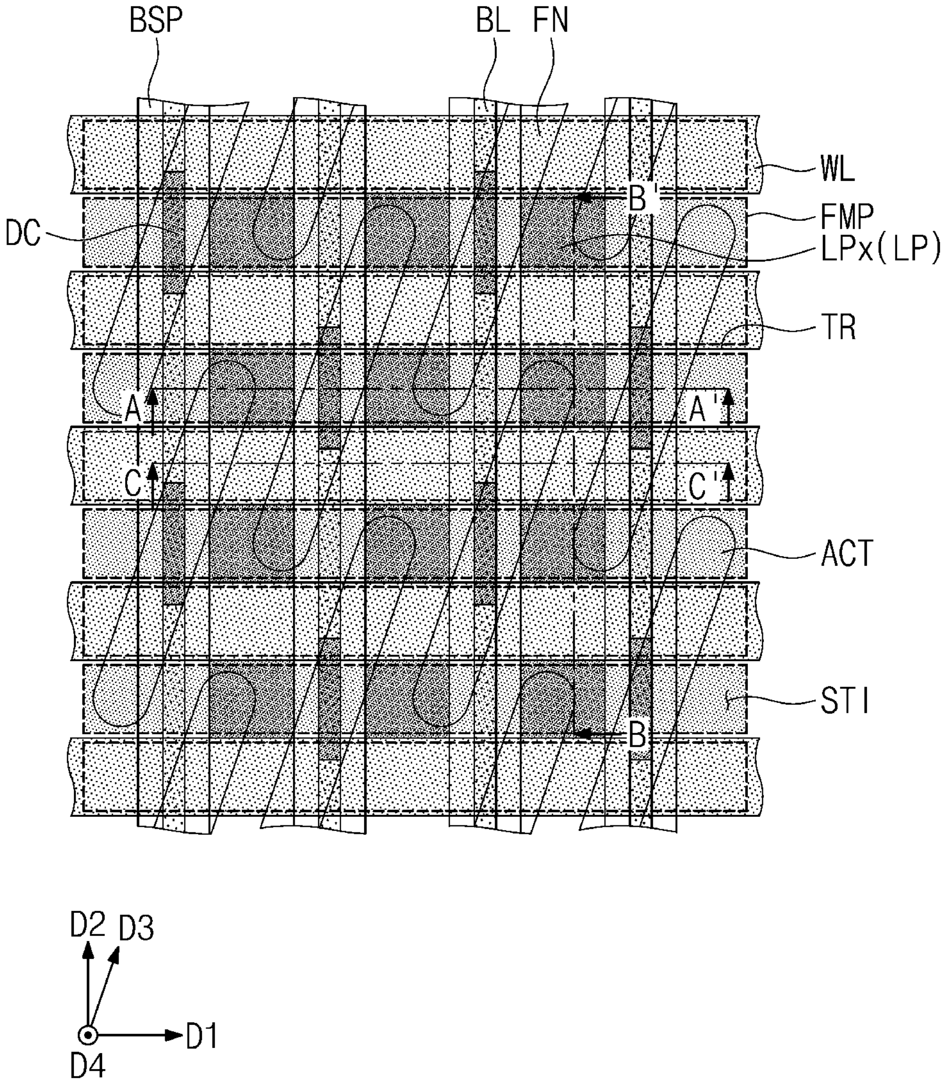
Figure 10A:
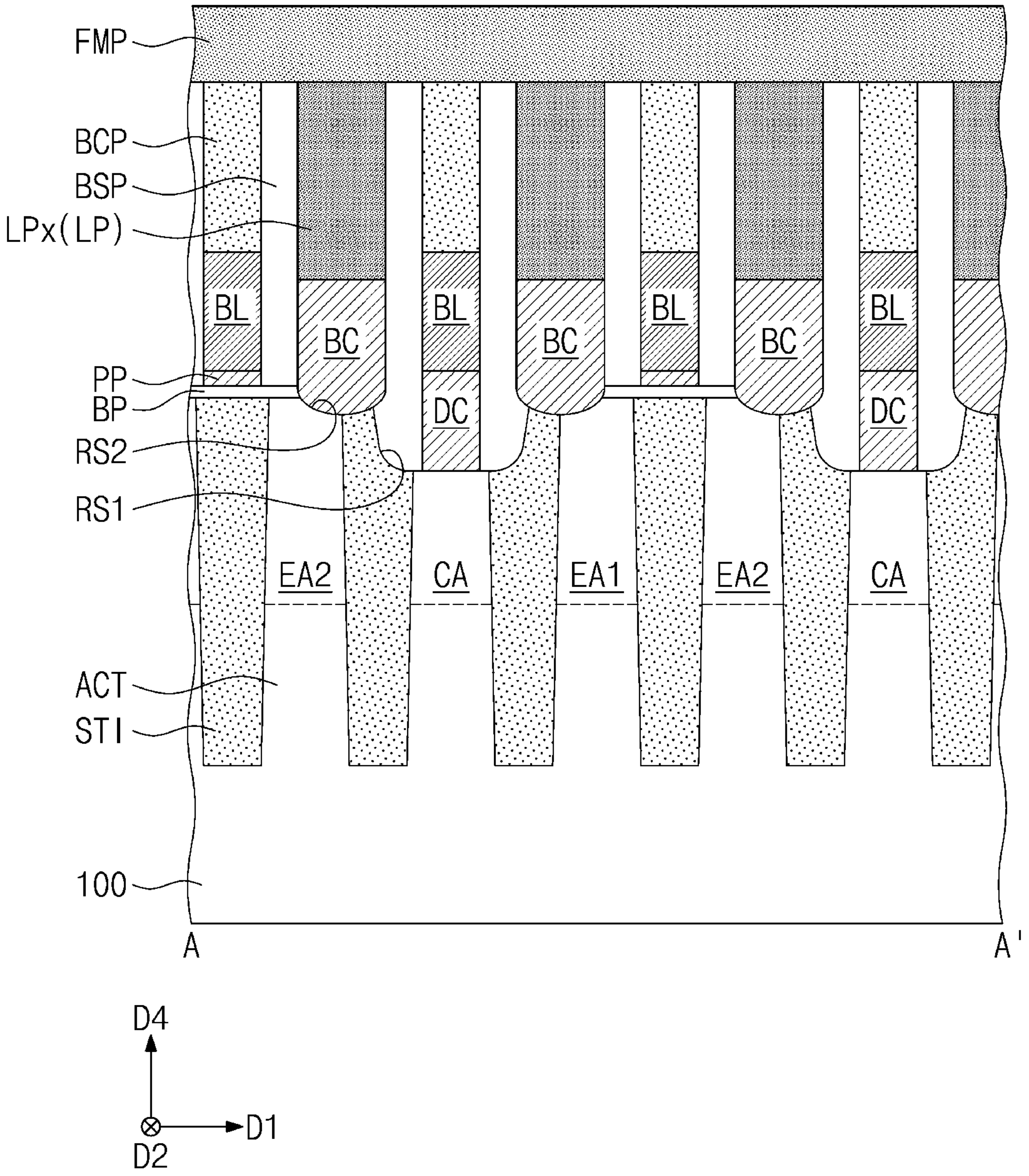
Figure 10B:
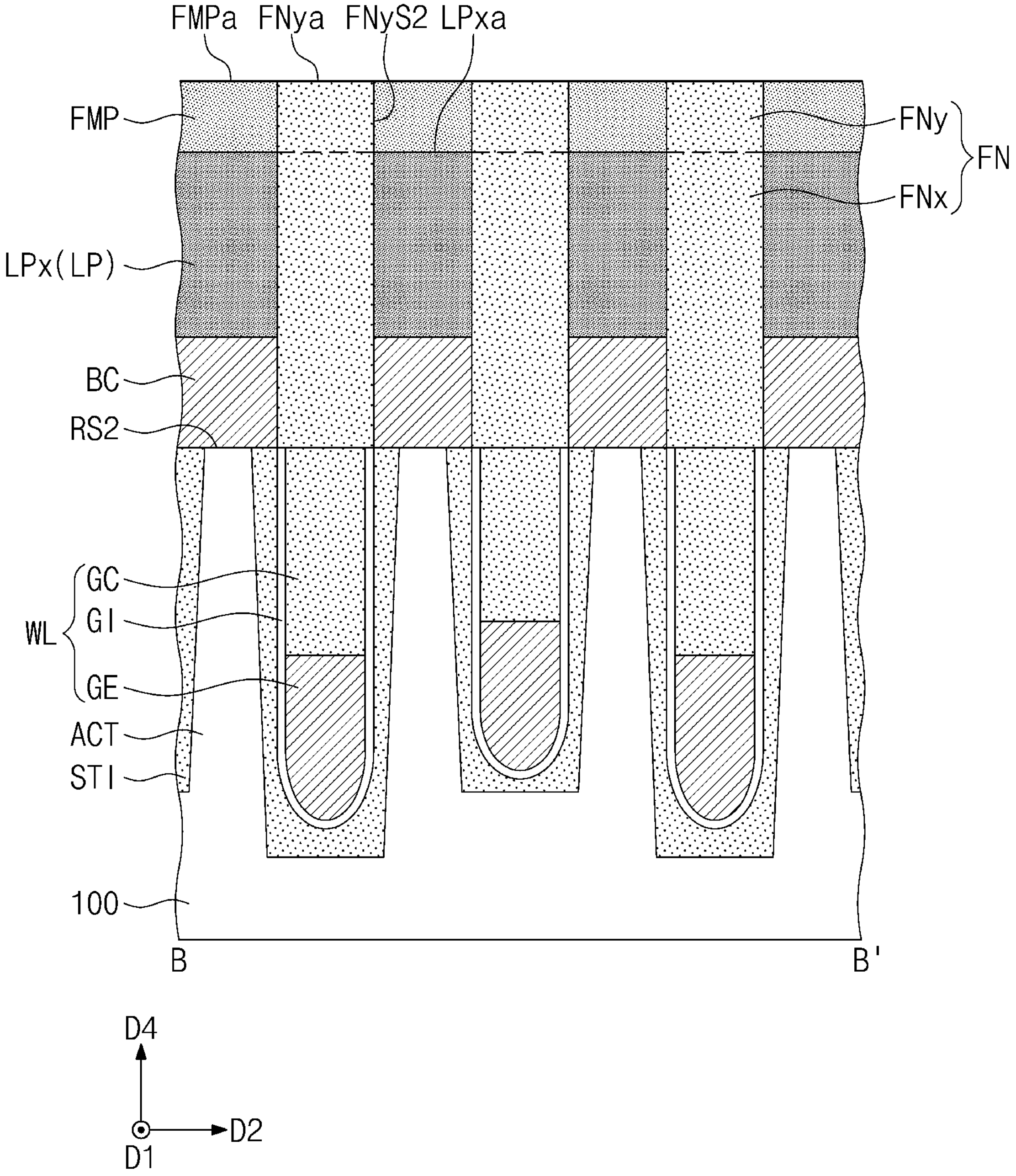
Figure 10C:
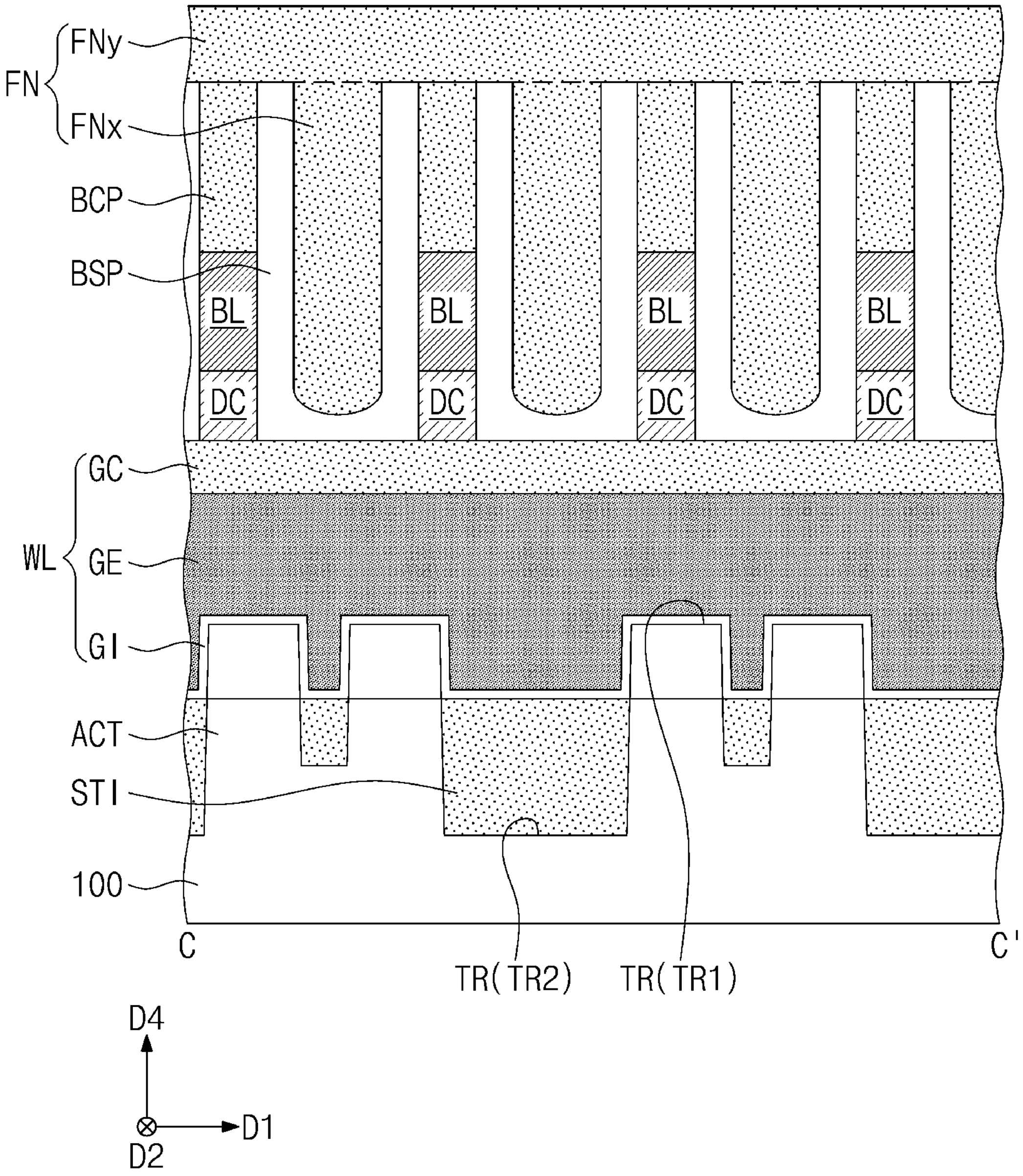

FIGS. 5 to 10C illustrate plan and cross-sectional views showing a method of fabricating a semiconductor device according to some embodiments of the present inventive concepts. FIGS. 5, 7, and 9 illustrate plan views showing a method of fabricating a semiconductor device according to some embodiments of the present inventive concepts. FIGS. 6A, 8A, and 10A illustrate cross-sectional views taken along line A-A' of FIGS. 5, 7, and 9, respectively. FIGS. 6B, 8B, and 10B illustrate cross-sectional views taken along line B-B' of FIGS. 5, 7, and 9, respectively. FIGS. 6C, 8C, and 10C illustrate cross-sectional views taken along line C-C' of FIGS. 5, 7, and 9, respectively.

Referring to FIGS. 5 and 6A to 6C, a substrate 100 may be provided. A device isolation pattern STI may be formed and buried in an upper portion of the substrate 100. The formation of the device isolation pattern STI may include performing a patterning process to partially remove an upper portion of the substrate 100, and filling a removed region with the device isolation pattern STI. Active patterns ACT may be defined to indicate regions of the substrate 100 (e.g., non-removed upper portions of the substrate 100) that are surrounded by the device isolation pattern STI. Impurity regions may be formed in the active patterns ACT. The formation of the impurity regions may include performing an ion implantation process to implant impurities into the active patterns ACT.

Word lines WL may be formed in trenches formed on an upper portion of the substrate 100. The formation of the word lines WL may include forming mask patterns (not shown) on the active patterns ACT and the device isolation pattern STI, using the mask patterns to perform an anisotropic etching process to form the trenches, and partially or completely filling the trenches with the word lines WL.

The filling of the trench with the word line WL may include, for example, conformally depositing a gate dielectric pattern GI on an inner surface of the trench, filling the trench with a conductive layer, allowing the conductive layer to undergo an etch-back process and/or a polishing process to form a gate electrode GE, and forming on the gate electrode GE a gate capping pattern GC that fills an unoccupied portion of the trench.

A buffer pattern BP and a polysilicon pattern PP may be sequentially formed on the substrate 100. The buffer pattern BP and the polysilicon pattern PP may be formed to cover or overlap the active patterns ACT and the device isolation pattern STI.

First recesses RS1 may be formed on the active patterns ACT and the device isolation pattern STI. When the first recess RS1 is formed, the buffer pattern BP and the polysilicon pattern PP may be partially removed. Bit-line contact layers DCL may be formed to fill the first recesses RS1.

A first bit-line mask layer BMP1L may be formed on a front surface of the substrate 100. The first bit-line mask layer BMP1L may include a dielectric material having an etch selectivity with respect to surrounding components (e.g., a bit-line spacer BSP and a storage node contact BC which will be discussed below). For example, the first bit-line mask layer BMP1L may include at least one of silicon oxide ($SiO_2$) and/or silicon oxycarbide (SiOC). A first barrier layer (not shown) may further be formed between the first bit-line mask layer BMP1L and the bit-line contact layer DCL.

A second bit-line mask pattern BMP2 may be formed on the first bit-line mask layer BMP1L. The second bit-line mask pattern BMP2 may extend in a second direction D2. The second bit-line mask pattern BMP2 may be provided in plural, and the plurality of second bit-line mask patterns BMP2 may be spaced apart from each other in a first direction D1.

Referring to FIGS. 7 and 8A to 8C, bit-line contacts DC and first bit-line mask patterns BMP1 may be formed by using the second bit-line mask patterns BMP2 as an etching mask to remove portions of the bit-line contact layers DCL and a portion of the first bit-line mask layer BMP1L. Non-removed portions of the bit-line contact layers DCL may constitute or be the bit-line contacts DC. A non-removed portion of the first bit-line mask layer BMP1L may constitute or be the first bit-line mask patterns BMP1. The first bit-line mask patterns BMP1 may be formed on the bit-line contacts DC. The first bit-line mask patterns BMP1 may extend in the second direction D2 on the active patterns ACT. The first bit-line mask patterns BMP1 may be spaced apart from each other in the first direction D1.

A bit-line spacer BSP may be formed to fill an unoccupied portion of the first recess RS1 and to cover or overlap a lateral surface of the bit-line contact DC and a lateral surface of the first bit-line mask pattern BMP1. The formation of the bit-line spacer BSP may include forming a plurality of spacers. For example, first to third spacers may be sequentially formed on the lateral surface of the first bit-line mask pattern BMP1.

Storage node contacts BC may be formed between the first bit-line mask patterns BMP1 that neighbor each other in the first direction D1. The formation of the storage node contacts BC may include performing a removal process on a portion of the bit-line spacer BSP, forming second recesses RS2 by removing a portion of the buffer pattern BP, a portion of each of first and second edge parts EA1 and EA2 of the active pattern ACT and a portion of the device isolation pattern STI, forming a storage node contact layer (not shown) to fill a space between the second recesses RS2 and the first bit-line mask patterns BMP1 and to cover or overlap top surfaces of the first bit-line mask patterns BMP1, and removing the storage node contact layer on the top surfaces of the first bit-line mask patterns BMP1 to separate from each other the storage node contacts BC that neighbor each other in the first direction D1. A chemical mechanical polishing (CMP) process may be performed to remove the storage node contact layer on the top surfaces of the first bit-line mask patterns BMP1.

Referring to FIGS. 9 and 10A to 10C, bit lines BL may be formed on the bit-line contacts DC. For example, the formation of the bit lines BL may include removing the first bit-line mask patterns BMP1 on the bit-line contacts DC, and forming the bit line BL in a portion of each of regions where the first bit-line mask patterns BMP1 are removed. The bit lines BL may be formed by selective epitaxial growth. The selective epitaxial growth may be one of deposition methods by which a specific material is grown only on a particular region.

According to the present inventive concepts, the bit line BL may be formed through selective epitaxial growth. Thus, the bit line BL may be formed to have grains whose crystallographic directions are the same. As a result, the bit line BL may decrease in resistance, and a semiconductor device may increase in electrical properties.

Bit-line capping patterns BCP may be formed on the bit lines BL. For example, the formation of the bit-line capping patterns BCP may include forming a bit-line capping layer (not shown) to fill unoccupied portions of regions where the first bit-line mask patterns BMP1 are removed and to cover or overlap top surfaces of the storage node contacts BC, and removing the bit-line capping layer on the top surfaces of the storage node contacts BC to separate from each other the bit-line capping patterns BCP that neighbor each other in the first direction D1. For example, a chemical mechanical polishing (CMP) process may be performed to remove the bit-line capping layer on the top surface of the storage node contact BC.

According to the present inventive concepts, the bit line BL and the bit-line capping pattern BCP may be sequentially formed in a region where the first bit-line mask pattern BMP1 is removed. Therefore, an etching process for forming the bit line BL and the bit-line capping pattern BCP may not be separately performed. In contrast, the bit-line contact DC, the bit line BL, and the bit-line capping pattern BCP may be formed by individual etching processes. In this case, the bit-line capping pattern BCP may be used as an etching mask, and may be formed to have a height that is greater than when the bit-line capping pattern BCP is not used as an etching mask. As a result, the bit-line capping pattern BCP may have a high aspect ratio, and thus when an etching process is performed for each of the bit-line contact DC, the bit line BL, and the bit-line capping pattern BCP, collapse may occur at each of the bit-line contact DC, the bit line BL, and the bit-line capping pattern BCP. Therefore, a fabrication process in which the first bit-line mask pattern BMP1 is used to form the bit line BL and the bit-line capping pattern BCP may be easier than a fabrication process in which an etching process is performed to form each of the bit line BL and the bit-line capping pattern BCP, which may increase productivity of a semiconductor device.

Lower landing pads LPx may be formed on the storage node contacts BC. For example, the formation of the lower landing pads LPx may include removing an upper portion of each of the storage node contacts BC, forming a lower landing pad layer to fill a region where the upper portion of each of the storage node contacts BC is removed and to cover or overlap top surfaces of the bit-line capping patterns BCP, and removing the lower landing pad layer on the top surfaces of the bit-line capping patterns BCP to form the lower landing pads LPx that neighbor each other in the first direction D1. A chemical mechanical polishing (CMP) process may be performed to remove the lower landing pad layer on the top surface of the first bit-line capping pattern BCP. A top surface LPxa of the lower landing pad LPx and the top surface of the bit-line capping pattern BCP may be located at substantially the same level or height and may be coplanar with each other.

A fence mask pattern FMP may be formed to extend in the first direction D1 on the lower landing pad LPx. The fence mask pattern FMP may be provided in plural. The plurality of fence mask patterns FMP may be spaced apart from each other in the second direction D2. The fence mask pattern FMP may include a dielectric material having an etch selectivity with respect to surrounding components (e.g., a fence pattern FN which will be discussed below). For example, the fence mask pattern FMP may include at least one of silicon oxide ($SiO_2$) and/or silicon oxycarbide (SiOC).

Fence patterns FN may be formed between the bit lines BL that neighbor each other in the first direction D1 and between the fence mask patterns FMP that neighbor each other in the second direction D2. For example, the formation of the fence pattern FN may include using the fence mask patterns FMP as an etching mask to remove portions of the storage node contacts BC and portions of the lower landing pads LPx, and forming the fence patterns FN to fill regions where the portions of the storage node contacts BC and the portions of the lower landing pads LPx are removed and to also to fill a space between the fence mask patterns FMP. A lower fence pattern FNx may be defined to indicate a portion of the fence pattern FN that fills the regions where the portions of the storage node contacts BC and the portions of the lower landing pads LPx are removed. An upper fence pattern FNy may be defined to indicate another portion of the fence pattern FN that fills a space between the fence mask patterns FMP. The lower fence pattern FNx and the upper fence pattern FNy may constitute or be the fence pattern FN. The lower fence pattern FNx may be formed to extend in a fourth direction D4 between the bit lines BL that neighbor each other in the first direction D1. The upper fence pattern FNy may be formed to extend in the first direction D1 between the fence mask patterns FMP that neighbor each other in the second direction D2. A top surface FNya of the upper fence pattern FNy may be located at a level or height higher than that of the top surface LPxa of the lower landing pad LPx and substantially the same as that of a top surface FMPa of the fence mask pattern FMP. A second lateral surface FNyS2 of the upper fence pattern FNy may be in contact with the fence mask pattern FMP. When the fence patterns FN are formed, the fence patterns FN may separate one storage node contact BC into a plurality of storage node contacts BC that are spaced apart from each other in the second direction D2, and may separate one lower landing pad LPx into a plurality of lower landing pads LPx that are spaced apart from each other in the second direction D2.

Referring to FIGS. 1 and 2A to 2C, upper landing pads LPy may be formed on the lower landing pads LPx. For example, the formation of the upper landing pads LPy may include removing the fence mask patterns FMP, forming an upper landing pad layer (not shown) to fill regions where the fence mask patterns FMP are removed and to cover or overlap the top surface FNya of the fence pattern FN, and removing the upper landing pads layer on the top surface FNya of the fence pattern FN to separate from each other the upper landing pads LPy that are spaced apart from each other in the second direction D2. The upper landing pads LPy, together with the upper fence patterns FNy, may extend in the first direction D1 on the lower landing pads LPx. A top surface LPya of the upper landing pad LPy and the top surface FNya of the fence pattern FN may be located at substantially the same level or height and may be coplanar with each other. The upper landing pads LPy that neighbor each other in the second direction D2 may be spaced apart from each other across the upper fence pattern FNy.

According to the present inventive concepts, the upper landing pads LPy may be formed between regions where the fence mask patterns FMP are removed (e.g., between the upper fence patterns FNy that neighbor each other in the second direction D2). It may thus be possible to omit a discrete patterning process for separating the upper landing pads LPy from each other in the second direction D2. In conclusion, the upper landing pads LPy may be easily formed, and a semiconductor device may increase in productivity.

Filling patterns FIL may be formed to run across or be on the upper landing pads LPy and the upper fence patterns FNy. The filling patterns FIL may be formed to extend in the second direction D2 on the bit lines BL. When the filling patterns FIL are formed, the filling pattern FIL may separate one upper fence pattern FNy into a plurality of upper fence patterns FNy that are spaced apart from each other in the first direction D1, and may separate one upper landing pad LPy into a plurality of upper landing pads LPy that are spaced apart from each other in the first direction D1. Thereafter, a data storage pattern DSP may be formed on each of the upper landing pads LPy.

Figure 11:
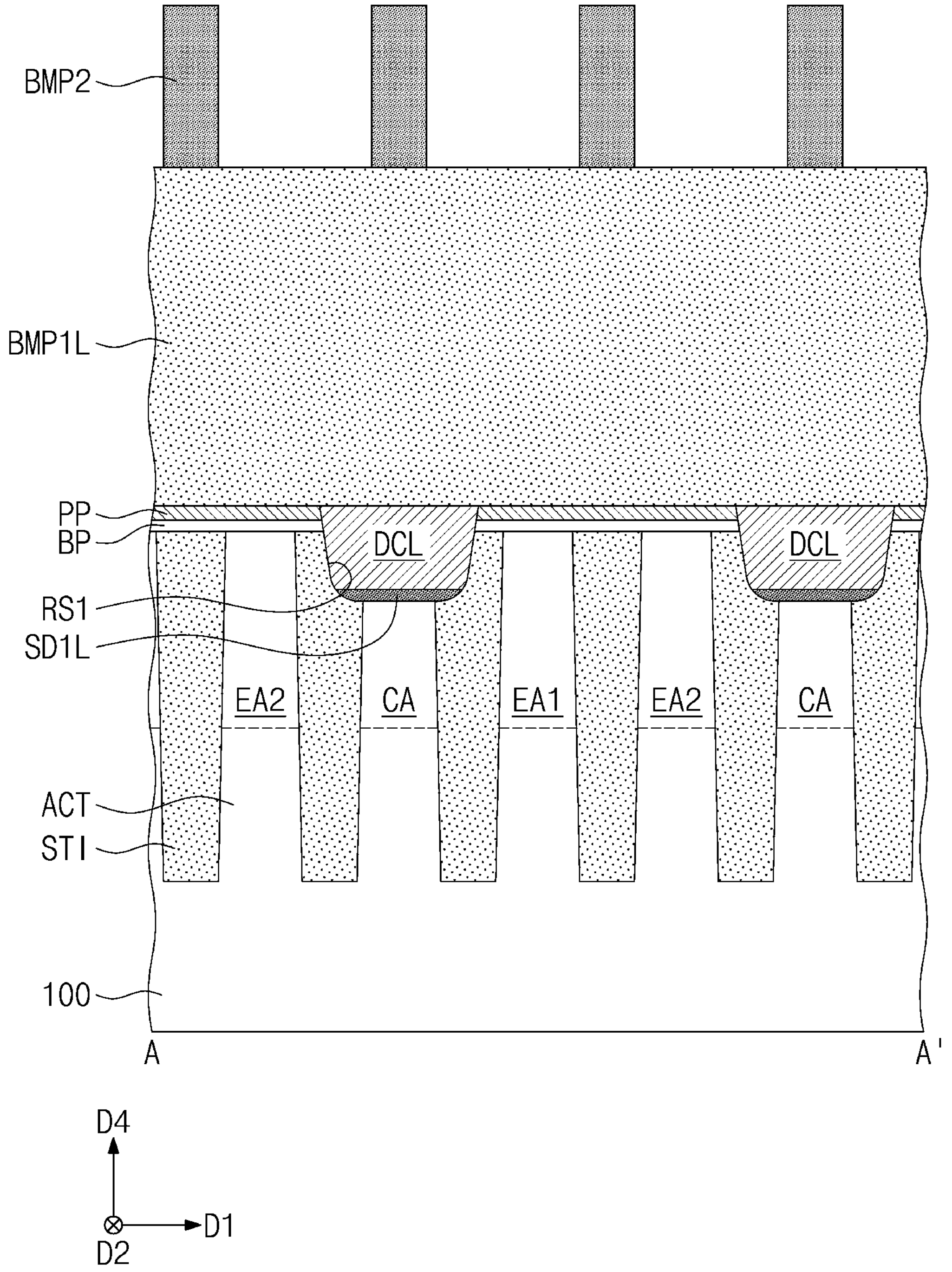
FIGS. 11 and 12 illustrate cross-sectional views showing a method of fabricating a semiconductor device according to some embodiments of the present inventive concepts.
Figure 12:
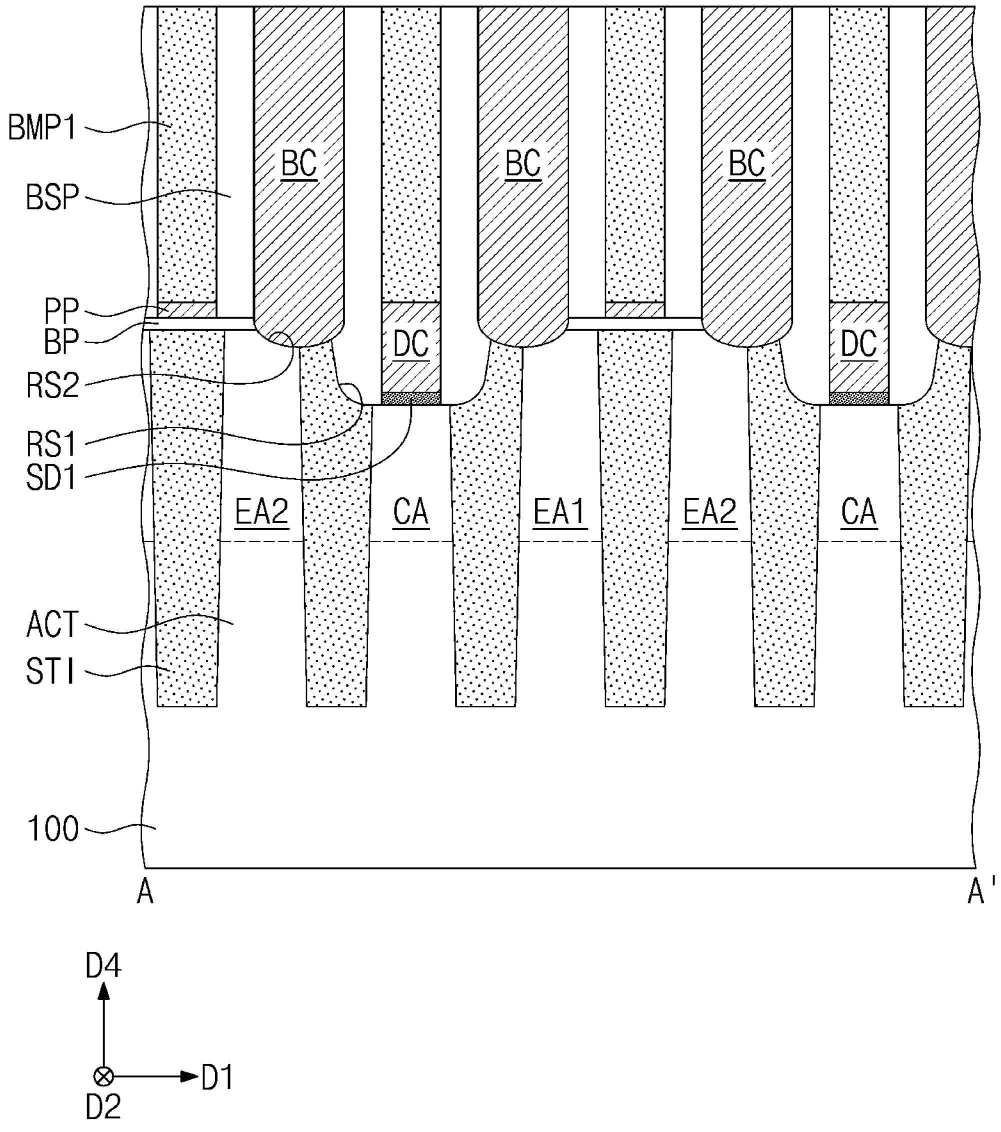

FIGS. 11 and 12 illustrate cross-sectional views showing a method of fabricating a semiconductor device according to some embodiments of the present inventive concepts.

Referring to FIG. 11, after the formation of the first recesses RS1 discussed with reference to FIGS. 6A to 6C, a first seed layer SD1L may be formed in the first recesses RS1. The first seed layer SD1L may be formed on the central parts CA of the active patterns ACT. For example, as shown, the first seed layer SD1L may cover, overlap, or be on inner bottom surfaces of the first recesses RS1. For another example, although not shown, the first seed layer SD1L may further cover inner lateral surfaces of the first recesses RS1.

Afterwards, bit-line contact layers DCL may be formed to fill the first recesses RS1. The bit-line contact layers DCL may be formed by a growth process in which the first seed layer SD1L is used as a seed.

Referring to FIG. 12, bit-line contacts DC may be formed through a fabrication process discussed above. In this procedure, a portion of the first seed layer SD1L may be removed, and a first seed pattern SD1 may be formed. Afterwards, a semiconductor device discussed with reference to FIG. 3 may be fabricated through a fabrication process discussed above.

Figure 13:
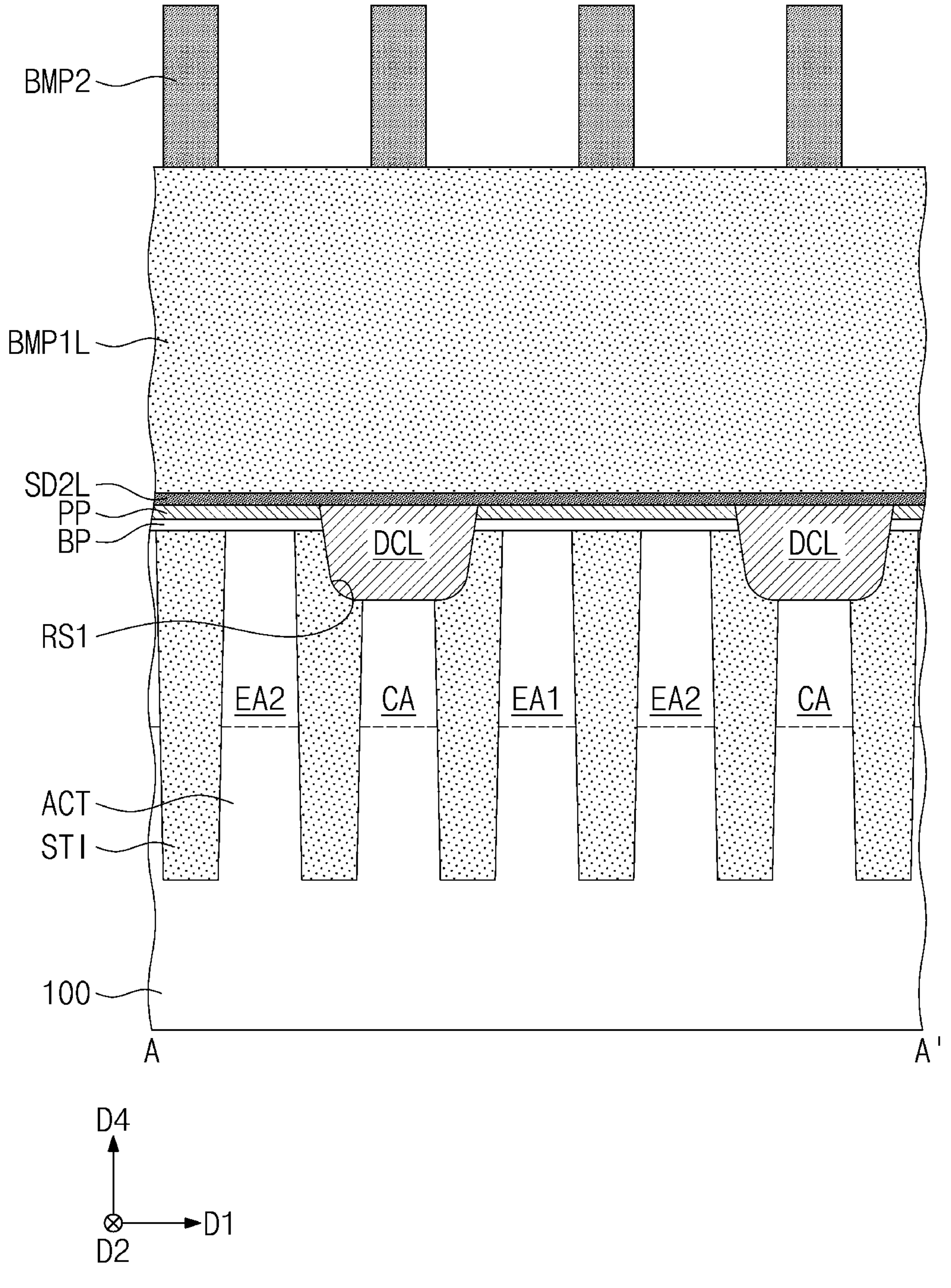
FIGS. 13 and 14 illustrate cross-sectional views showing a method of fabricating a semiconductor device according to some embodiments of the present inventive concepts.
Figure 14:
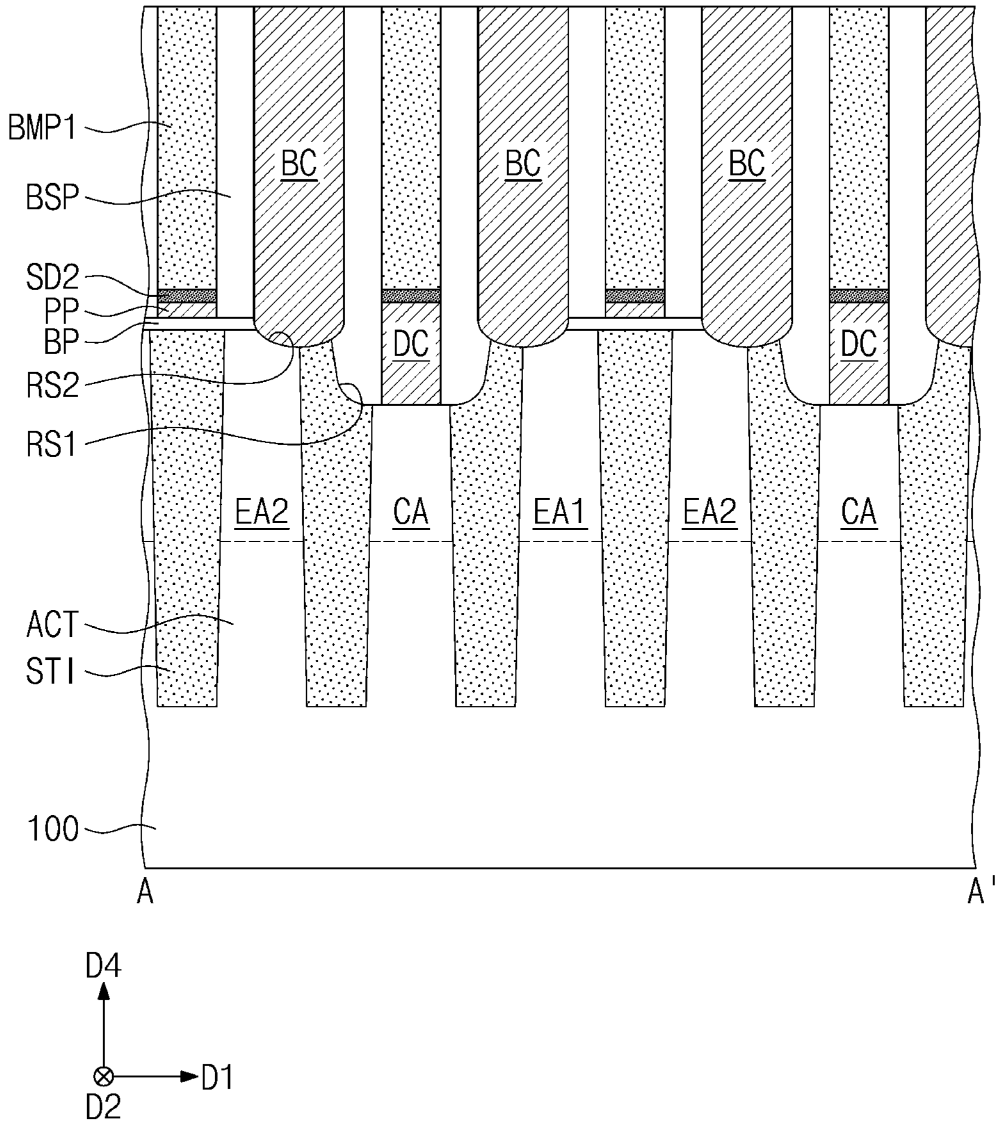

FIGS. 13 and 14 illustrate cross-sectional views showing a method of fabricating a semiconductor device according to some embodiments of the present inventive concepts.

Referring to FIG. 13, it may be possible to omit the formation of the first seed layer SD1L discussed with reference to FIG. 11. After the formation of the bit-line contact layers DCL discussed with reference to FIGS. 6A to 6C, a second seed layer SD2L may be formed on a front surface of the substrate 100. The second seed layer SD2L may be formed between the bit-line contact layers DCL and first bit-line mask layer BMP1L.

Referring to FIG. 14, bit-line contacts DC may be formed through a fabrication process discussed above. In this procedure, a portion of the second seed layer SD2L may be removed, and a second seed pattern SD2 may be formed. Afterwards, a semiconductor device discussed with reference to FIGS. 4A and 4B may be fabricated through a fabrication process discussed above.

According to the present inventive concepts, a bit line may be formed by selective epitaxial growth. Thus, the bit line may be formed to have grains whose crystallographic directions are the same. As a result, the bit line may decrease in resistance, and a semiconductor device may increase in electrical properties.

According to the present inventive concepts, a bit line and a bit-line capping pattern may be sequentially formed in a region where a first bit-line mask pattern is removed. Thus, etching processes for forming the bit line and the bit-line capping pattern may not be separately performed. Accordingly, the bit line and the bit-line capping pattern may be easily formed, and a semiconductor device may increase in productivity, performance, or yield.

According to the present inventive concepts, upper landing pads may be formed in regions where fence mask patterns are removed (e.g., between upper fence patterns that neighbor each other in the second direction). It may thus be possible to omit a discrete patterning process for separating the upper landing pads from each other in the second direction. In conclusion, the upper landing pads may be easily formed, and a semiconductor device may increase in productivity, performance, or yield.

The aforementioned description provides some embodiments for explaining the present inventive concepts. Therefore, the present inventive concepts are not limited to the embodiments described above, and it will be understood by one of ordinary skill in the art that variations in form and detail may be made therein without departing from the spirit and features of the present inventive concepts.

What is claimed is:

1. A semiconductor device, comprising:

an active pattern on a substrate and surrounded by a device isolation pattern in plan view;

a word line that extends in a first direction and is on the active pattern and the device isolation pattern, wherein the first direction is parallel to a bottom surface of the substrate;

a bit line that extends in a second direction on the active pattern, wherein the second direction intersects the first direction;

a storage node contact on the active pattern;

a landing pad that includes a lower landing pad and an upper landing pad with an interface therebetween that are stacked on the storage node contact; and a fence pattern on the word line and a lateral surface of the landing pad and a lateral surface of the storage node contact, wherein a top surface of the fence pattern is higher than a top surface of the lower landing pad adjacent the interface between the lower landing pad and the upper landing pad, with respect to the substrate.

2. The semiconductor device of claim 1, wherein the top surface of the fence pattern is substantially a same height as a top surface of the upper landing pad with respect to the substrate.

3. The semiconductor device of claim 1, wherein the upper landing pad protrudes in the first direction beyond the lower landing pad.

4. The semiconductor device of claim 1, further comprising:

a bit-line capping pattern on the bit line, wherein the upper landing pad is higher than the bit-line capping pattern with respect to the substrate.

5. The semiconductor device of claim 4, further comprising:

a bit-line spacer on a lateral surface of the bit-line capping pattern, wherein the fence pattern is on a top surface of the bit-line spacer.

6. The semiconductor device of claim 1, wherein the fence pattern includes a lower fence pattern and an upper fence pattern that are distinguished from each other with no interface, wherein the upper fence pattern protrudes in the first direction beyond the lower fence pattern.

7. The semiconductor device of claim 1, wherein the bit line includes a material having grains whose crystallographic directions are same directions.

8. The semiconductor device of claim 1, further comprising:

a filling pattern that extends in the second direction on the bit line, wherein a top surface of the filling pattern is substantially a same height as the top surface of the fence pattern with respect to the substrate.

9. The semiconductor device of claim 1, further comprising:

a bit-line contact between the bit line and the active pattern; and a first seed pattern between the bit-line contact and the active pattern.

10. The semiconductor device of claim 1, further comprising:

a bit-line contact between the bit line and the active pattern; and a second seed pattern between the bit line and the bit-line contact.

11. A semiconductor device, comprising:

an active pattern on a substrate and surrounded by a device isolation pattern in plan view;

a word line that extends in a first direction and is on the active pattern and the device isolation pattern, wherein the first direction is parallel to a bottom surface of the substrate;

a bit line that extends in a second direction on the active pattern, wherein the second direction intersects the first direction;

a storage node contact on the active pattern;

a landing pad on the storage node contact; and a fence pattern on the word line and a lateral surface of the landing pad and a lateral surface of the storage node contact, wherein the fence pattern includes:

a lower fence pattern on a lateral surface of the bit line; and an upper fence pattern on the lower fence pattern and that protrudes in the first direction beyond the lower fence pattern.

12. The semiconductor device of claim 11, further comprising:

a bit-line spacer between the lower fence pattern and the bit line, wherein the upper fence pattern is on a top surface of the bit-line spacer.

13. The semiconductor device of claim 11, wherein the landing pad includes a lower landing pad and an upper landing pad that are stacked on the storage node contact, wherein a top surface of the upper landing pad is substantially a same height as a top surface of the upper fence pattern with respect to the substrate.

14. The semiconductor device of claim 13, wherein the upper landing pad and the lower landing pad are in contact with each other at an interface.

15. The semiconductor device of claim 11, further comprising:

a filling pattern on the bit line and extending in the second direction, wherein a top surface of the filling pattern is substantially a same height as a top surface of the upper fence pattern with respect to the substrate.

16. The semiconductor device of claim 15, wherein the upper fence pattern comprises:

a first lateral surface in the first direction; and a second lateral surface in the second direction, wherein the first lateral surface of the upper fence pattern is in contact with the filling pattern, and wherein the second lateral surface of the upper fence pattern is in contact with the landing pad.

17. A semiconductor device, comprising:

an active pattern on a substrate and surrounded by a device isolation pattern in plan view;

a word line that extends in a first direction and is on the active pattern and the device isolation pattern, wherein the first direction is parallel to a bottom surface of the substrate;

a bit line that extends in a second direction on the active pattern, wherein the second direction intersects the first direction;

a storage node contact on the active pattern;

a landing pad on the storage node contact;

a fence pattern on the word line and a lateral surface of the landing pad; and a filling pattern on the bit line and extending in the second direction, wherein a top surface of the fence pattern is substantially a same height as a top surface of the filling pattern with respect to the substrate.

18. The semiconductor device of claim 17, wherein the filling pattern includes a plurality of filling patterns that neighbor each other in the first direction, and wherein the landing pad is between neighboring filling patterns of the plurality of filling patterns.

19. The semiconductor device of claim 17, wherein the filling pattern includes a plurality of filling patterns that neighbor each other in the first direction, and wherein the fence pattern is between neighboring filling patterns of the plurality of filling patterns.

20. The semiconductor device of claim 17, wherein the landing pad comprises:

a first lateral surface in the first direction; and a second lateral surface in the second direction, wherein the first lateral surface of the landing pad is in contact with the filling pattern, and wherein the second lateral surface of the landing pad is in contact with the fence pattern.

* * * * *